(12) United States Patent
Narui et al.

(10) Patent No.: US 6,459,714 B1
(45) Date of Patent: Oct. 1, 2002

(54) HEAT EMISSION APPARATUS IN A SEMICONDUCTOR LASER

(75) Inventors: Hironobu Narui, Kanagawa; Takehiro Taniguchi, Tokyo; Noriko Ueno; Nobukata Okano, both of Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/325,451

(22) Filed: Jun. 3, 1999

(30) Foreign Application Priority Data

Jun. 4, 1998 (JP) ............................................. 10-173919

(51) Int. Cl.$^7$ ................................................ H01S 5/00
(52) U.S. Cl. ............................... 372/48; 372/50; 438/28
(58) Field of Search .............................. 438/28; 372/50, 372/48, 30

(56) References Cited

U.S. PATENT DOCUMENTS

| | | | | |
|---|---|---|---|---|
| 4,977,570 A | * | 12/1990 | Hasegawa | 372/50 |
| 5,585,309 A | * | 12/1996 | Mori et al. | 437/129 |
| 5,608,749 A | * | 3/1997 | Kizuki | 372/50 |
| 6,052,399 A | * | 4/2000 | Sun | 372/50 |
| 6,081,636 A | * | 6/2000 | Kinoshita | 385/24 |

* cited by examiner

*Primary Examiner*—Paul Ip
*Assistant Examiner*—Cornelius H Jackson
(74) *Attorney, Agent, or Firm*—Sonnenschein, Nath & Rosenthal

(57) ABSTRACT

It is an object to provide a semiconductor emission element which can promote radiation while being manufactured easily, and a method of manufacturing the same. In the semiconductor emission element of the invention, a plurality of the laser oscillator are formed on the opposite side of a base of a substrate which is supported by the base. P-sides electrodes are connected to the laser oscillator while extract electrodes having a function of radiation by thickening its thickness are connected to the p-side electrodes. The extract electrodes cover two of the laser oscillators while covering the other two laser oscillators with insulating layers in between. As a result, thermal interference can be terminated while deterioration of the performance of the emitting portion by generation of heat can be suppressed even if the substrate is provided on the base with the opposite side of the emitting portion of the substrate facing the base.

34 Claims, 21 Drawing Sheets

HEAT EMISSION APPARATUS IN A SEMICONDUCTOR LASER

RELATED APPLICATION DATA

The present application claims priority to Japanese Application No. P10-173929 filed Jun. 4, 1998, which application is incorporated herein by reference to the extent permitted by law.

BACKGROUND OF THE INVENTION

1. Field of the Invention

The invention relates to a semiconductor emission element comprising a plurality of emitting portions on the same substrate and a method of manufacturing the same.

2. Description of the Related Art

Today, various kinds of apparatuses such as an optical disk device, a laser-beam printer, a duplicator and so on using a laser diode (LD) which is a semiconductor emission element have been developed so far. Recently, a high-speed operation and high performance in each of these apparatuses have been sought, and using a plurality of laser beams is thought to be one method for achieving them. For example, reading speed in an optical disk device can be easily made faster through simultaneously reading a plurality of tracks using a plurality of laser beams. Accordingly, developing a semiconductor laser (that is, multi-beam laser) which is able to simultaneously emit a plurality of laser beams has been required.

FIG. 1 shows a disassembled configuration of a multi-beam laser of the related art. The multi-beam laser 100 comprises four laser oscillators 120 formed on the same substrate 111, and each contact electrode 181 formed respectively on a base 180 through each wire 182 is electrically connected to each electrode 115. However not shown in figure, each wire connecting portion for connecting an electrode through each wire is respectively provided in each of the wires 182. Each of the laser oscillators 120 are respectively connected to power source (not shown in figure) through each wire 182 being respectively connected to each of the wire connecting portions.

When manufacturing such multi-beam laser, first, each of the laser oscillators 120 is respectively formed on the substrate 111. Next, apart from that, each of the contact electrodes 181 are respectively formed in the base 180 before respectively connecting each of the laser oscillators 120 formed in the substrate 111 and each of the contact electrodes 181 formed in the base 180 to each other. Accordingly, there is a problem with this multi-beam laser that mass production is difficult since alignment of the position of each of the laser oscillators 120 and each of the contact electrodes 181 becomes difficult when the spaces between each of the laser oscillators 120 become extremely narrow. Recently, an idea of placing the substrate 111 to the base 180 with the laser oscillator 120 side of the substrate 111 placed towards the opposite side of the base 180 has been considered. A multibeam laser can be easily manufactured without having a problem in alignment of the position if the substrate 111 is made to be supported by the base 180 as described.

However, on the other hand, in a case where the laser oscillator 120 side of the substrate 111 is placed towards the opposite side of the base 180, radiation of heat generated in each of the laser oscillators 120 becomes more difficult comparing to a case of the related art. For example, in a case where the laser oscillator 120 side of the substrate 111 is placed towards the base 180 side as the related art, the base 180 can serve a radiating function by forming it with a material with high thermal conductivity such as aluminum nitride (AlN) so that heat generated in each of the laser oscillators 120 can be actively radiated through the base 180. In contrast, in a case where the laser oscillator 120 side of the substrate 111 is placed towards the opposite side of the base 180, the distance between the laser oscillator 120 and the base 180 becomes further so that the radiating function of the base 180 can not be expected. Accordingly, in a case where the laser oscillator 120 side of the substrate 111 is placed towards the opposite side of the base 180, there is a problem that threshold current of each of the laser oscillators 120 is increased and the emission power is decreased unless radiation of heat is encouraged in someways.

The invention is designed to overcome the foregoing problems. It is an object to provide a semiconductor emission element which is able to be easily manufactured while encouraging radiation and a method of manufacturing the same.

SUMMARY OF THE INVENTION

A semiconductor emission element of the invention comprises: a base; a substrate supported by the base; a plurality of emitting portion each composed of a plurality of semiconductor layers which are formed by being laminated on the opposite side of the base of the substrate; a plurality of ohmic electrodes respectively provided on the opposite side of the substrate by corresponding to each of the emitting portion while being electrically connected to each of the emitting portion; and at least one radiation layer formed on the ohmic electrodes.

A method of manufacturing a semiconductor emission element of the invention includes the steps of: respectively forming a plurality of emitting portion each made of a plurality of semiconductor layers which area formed by being laminated on a substrate; respectively forming a plurality of ohmic electrodes on each of the emitting portion, which are electrically connected by being corresponded; forming at least one radiation layer on the ohmic electrodes; and supporting the substrate by a base by making the base face the opposite side of the emitting portion of the substrate.

In the semiconductor emission element of the invention, an electric current is flowed into each of the emitting portion through each of the ohmic electrodes and emission occurs in the emitting portion. At this time, generation of heat occurs in the emitting portion, however, the generated heat is actively radiated by a radiation layer. As a result, influence by generation of heat is eliminated and deterioration of the performance of the emitting portion is suppressed.

In a method of manufacturing a semiconductor emission element of the invention, a plurality of emitting portion respectively made of a plurality of semiconductor layers formed by being laminated on a substrate are respectively formed. Further, a plurality of ohmic electrodes are respectively formed on the substrate of each of the emitting portion while at least one radiation layer is formed on the emitting portion ins. Further, the substrate is supported by a base by making the base face the opposite side of the emitting portions of the substrate.

DETAILED DESCRIPTION OF THE PREFERRED EMBODIMENTS

Figure 1:
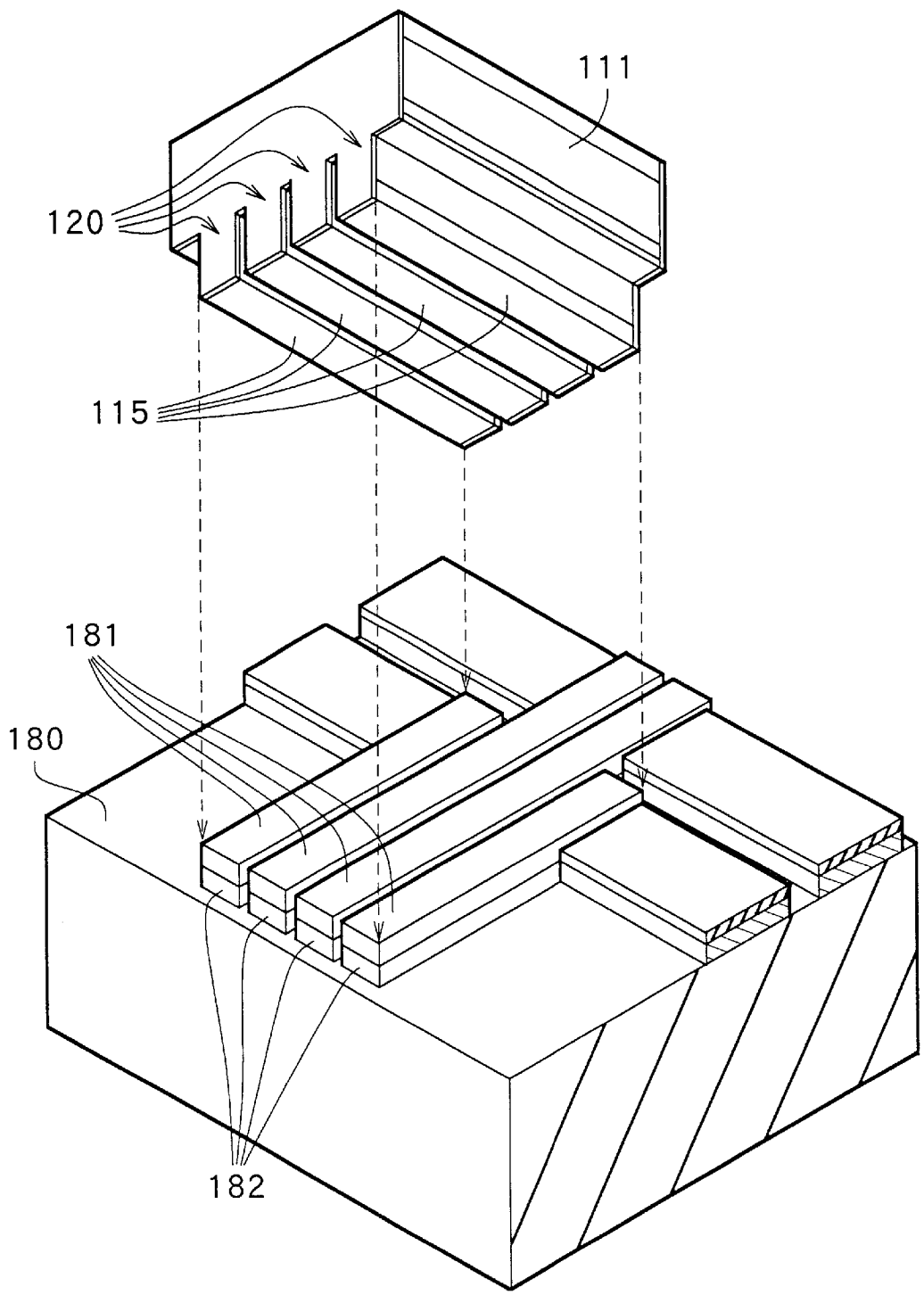
FIG. 1 is a cross section showing a configuration of a multi-beam laser of the related art.
Figure 2:
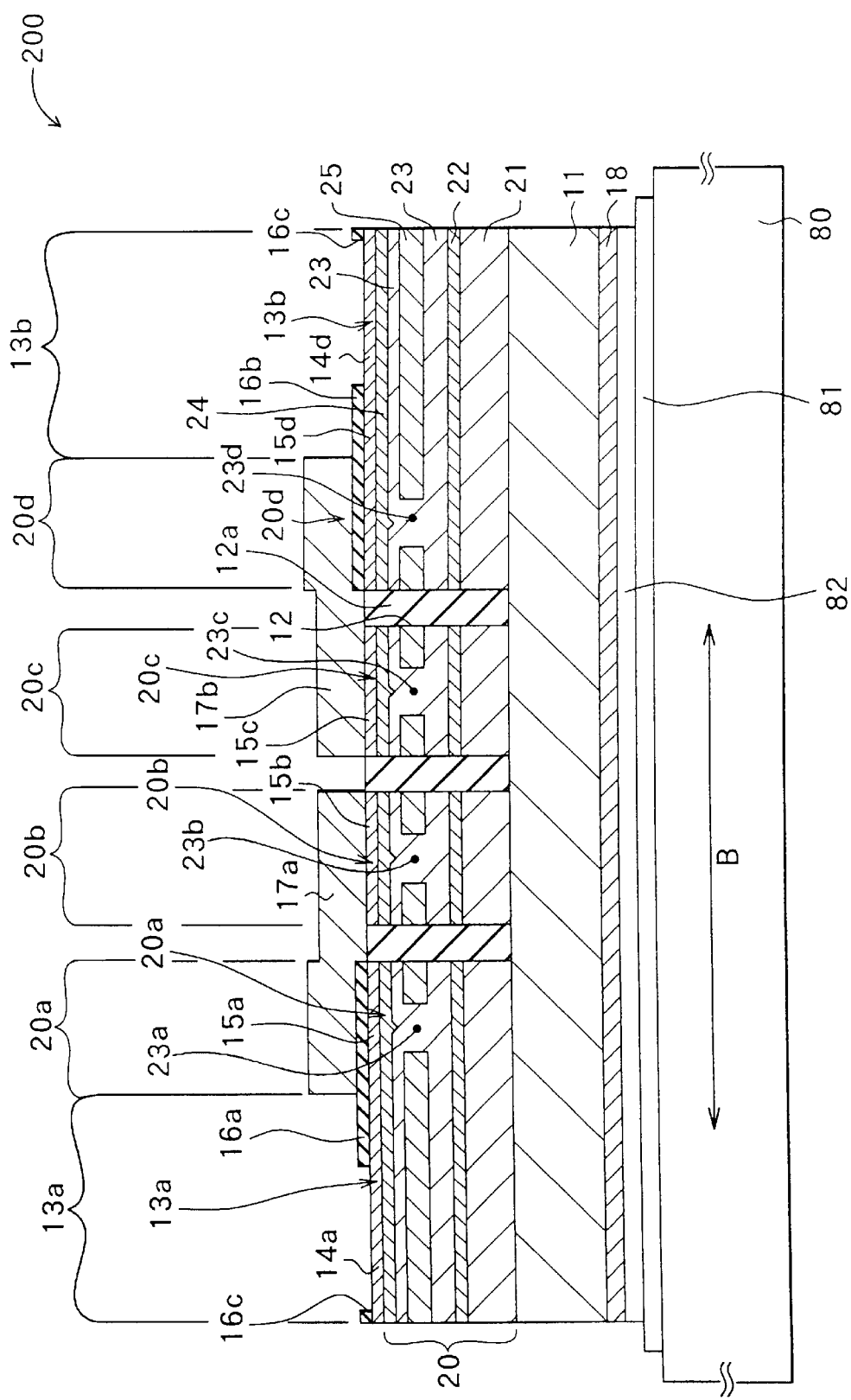
FIG. 2 is a cross section showing a configuration of the semiconductor laser according to the first embodiment of the invention.
Figure 3:
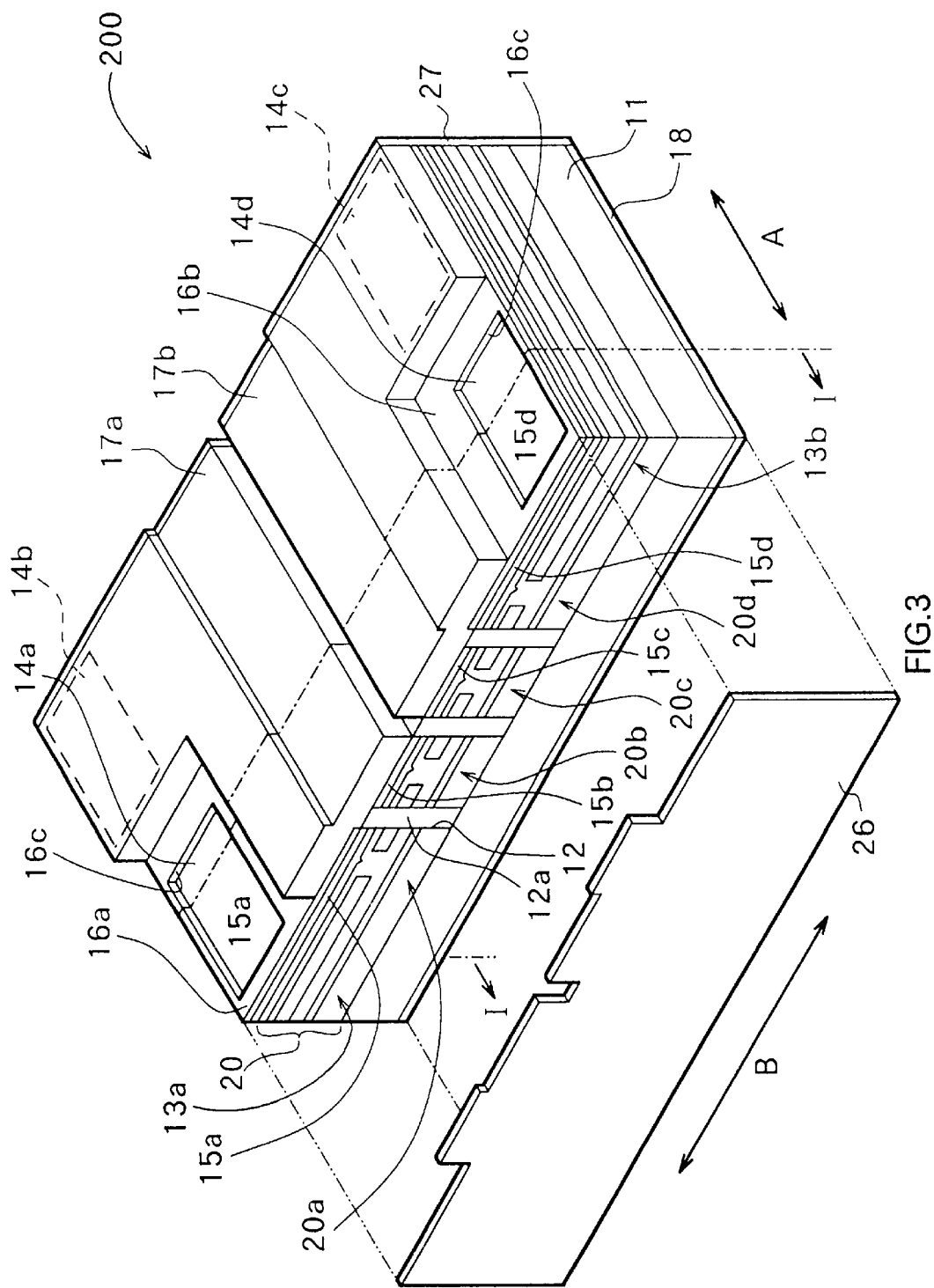
FIG. 3 is a disassembled perspective view showing part of the semiconductor laser shown in FIG. 2.

Preferred embodiments of the invention will be described in detail with reference to the figures in the followings.
First Embodiment FIG. 2 shows a partial cross sectional configuration of a semiconductor laser portion which is a semiconductor emission element according to a first embodiment of the invention. FIG. 3 shows part of the semiconductor laser shown in FIG. 2 by being disassembled. FIG. 2 is a cross sectional configuration taken along I—I line shown in FIG. 3.

The semiconductor laser 200, as shown in FIG. 2, comprises laser oscillators 20a, 20b, 20c and 20d as a plurality (four in this case) of emitting portion respectively placed on a surface (100 plane) side of the same substrate 11 with a separation groove 12 in between adjacent laser oscillators. Here, the laser oscillator 20a and the laser oscillator 20d are respectively placed on the outer side of the placement direction B. Laser oscillator 20a may be thought of as a first end emitting portion and laser oscillator 20d may be thought of as a second emitting portion. Moreover, the laser oscillator 20b is placed on the inner side of the placement direction B by being adjacent to the laser oscillator 20a while the laser oscillator 20c is placed on the inner side of the placement direction B by being adjacent to the laser oscillator 20d. Further, the placement direction B is a direction vertical to the resonator direction A as shown in FIG. 3.

The laser oscillators 20a, 20b, 20c, and 20d respectively take a shape of cuboid being formed with the side surfaces of the two pairs being in the edge in the direction parallel to a surface of the substrate 11. The side surfaces of one of the pairs are respectively placed in the edge of the resonator direction A while the surface sides of the other pair are respectively placed in the edge in a direction vertical to the resonator direction A. The size of each of the laser oscillators 20a, 20b, 20c and 20d are, for example, 500 µm in a length of the resonator direction A and 13 µm in a width in a direction vertical to the resonator direction A. The spaces (that is a width of each separation groove 12) between laser oscillators 20a, 20b, 20c and 20d are, for example, 2 µm, respectively.

A cuboid may be thought of as a rectangular parallelepiped. The laser oscillators 20a, 20b, 20c, and 20d respectively take a shape of cuboid being formed with the side surfaces of the two pairs being in the edge in the direction parallel to a surface of the substrate 11. The side surfaces of one of the pairs are respectively placed in the edge of the resonator direction A while the surface sides of the other pair are respectively placed in the edge in a direction vertical to the resonator direction A. The size of each of the laser oscillators 20a, 20b, 20c and 20d are, for example, 500 µm in a length of the resonator direction A and 13 µm in a thickness in a direction vertical to the resonator direction A. The spaces (that is a width of each separation groove 12) between laser oscillators 20a, 20b, 20c and 20d are, for example, 2 µm, respectively.

Each of the n-type clad layers 21 are, for example, 2 µm in a thickness in a direction vertical (simply called a thickness in the followings) to a surface of the substrate 11 and are respectively formed n-type AlGaAs mixed crystal to which silicon (Si) or selenium (Se) as n-type impurities are added. The composition ratio of the n-type AlGaAs mixed crystal in a class III chemical element is, for example, aluminum (Al) being 45% (mole %: same in the followings) and gallium (Ga) being 55%. Each of the active layers 22 are, for example, 80 nm in thickness and respectively formed with i-AlGaAs mixed crystal (i- represents that no impurities are added) to which no impurities are added. The composition ratio of the AlGaAs mixed crystal in a class III chemical element is, for example, aluminum being 14% and gallium being 86%.

Each of the n-type clad layers 23 are, for example, 2.5 µm in thickness and respectively formed with p-type AlGaAs mixed crystal to which zinc (Zn) as p-type impurities are added. The composition ratio of the n-type AlGaAs mixed crystal is, for example, aluminum being 45% and gallium being 55%. Each of the cap layers 24 are, for example, 0.5 µm in thickness and formed with p-type GaAs mixed crystal to which zinc as p-type. impurities are added.

A current blocking layer 25 is inserted to both sides along the resonator A in portion of each p-type clad layer 23 in a laminating direction. That is, portion in a laminating direction of each width of each p-type clad layer 23 which is vertical to the resonator A becomes narrower forming a current narrowing portion 23a, 23b, 23c, and 23d. The width of the current narrowing portion 23a is, for example, 4 µm. Each of the current blocking layers 25 is, for example, 1 µm in thickness and is respectively formed with n-type GaAs to which silicon or selenium as n-type impurities is added.

Further, the substrate 11 is, for example, 100 µm in thickness and formed with n-type GaAs to which silicon or selenium as n-type impurities are added.

The laser oscillators 20a, 20b, 20c and 20d also comprise, as shown in FIG. 3, a pair of continuing edge face films 26 and 27 in a pair of side surfaces located in the edge of the resonator A direction. The edge face film 26 is formed with aluminum oxide (Al$_2$O$_3$) having a low reflection rate while the edge face film 27 is formed by alternately laminating an aluminum oxide layer and an amorphous silicon layer having a high reflection rate. That is, the light generated in the active layer 22 is amplified by going back and forth between a pair of the edge face films 26 and 27 and emitted as the laser beam respectively.

An embedding layer 12a made of, for example, an insulator such as polyimide is formed in each separation groove 12 between the laser oscillators 20a, 20b, 20c, and 20d. Each of the embedding layers 12a are respectively formed from the surface of the substrate 11 to the position corresponding to p-side electrodes 15a, 15b, 15c, and 15d which are to be described later. That is, the surface of the laser oscillators 20a, 20b, 20c, 20d side is flattened in the position corresponding to the p-side electrodes 15a, 15b, 15c, and 15d.

An extract portion 13a formed facing the substrate 11 is provided on the outer side of the laser oscillator 20a in a placement direction B extendedly from the laser oscillator 20a. Further, like the laser oscillator 20a, an extract portion 13b formed on the substrate 11 is provided on the outer side of the laser oscillator 20d in a placement direction B extendedly from the laser oscillator 20d. The extract portions 13a and 13b have the same configurations as those of the laser oscillators 20a, 20b, 20c and 20d except that they do not comprise the current narrowing portion 23a or the current narrowing portion 23d.

Power source connecting portions 14a and 14b for electrically connecting power source (not shown in figure) to the laser oscillators 20a and 20b, respectively, are closer to the extract portion 13a by being corresponded are respectively formed on the opposite side of the substrate 11 of the extract portion 13a. Here, the power source connecting portion 14a corresponds to the laser oscillator 20a and the power source connecting portion 14b to the laser oscillator 20b. Further, like the extract portion 13a, power source connecting portions 14c and 14d for electrically connecting power source (not shown in figure) to the laser oscillators 20c and 20d, respectively, are closer to the extract portion 13b by being corresponded are respectively formed on the opposite side of the substrate 11 of the extract layer 13b. Here, the power source connecting portion 14c corresponds to the laser oscillator 20c and the power source connecting portion 14d to the laser oscillator 20d.

As described, the power source connecting portions 14a, 14b, 14c and 14d are respectively formed in a peripheral region of the laser oscillator so that the laser oscillators 20a, 20b, 20c and 20d are not affected by pressure applied when respectively connecting wires (not shown in figure).

P-side electrodes 15a, 15b, 15c and 15d as ohmic electrodes, which are electrically connected to the laser oscillators 20a, 20b, 20c and 20d by being corresponded, are respectively provided on the opposite side of the substrate 11 of the laser oscillators 20a, 20b, 20c and 20d. Here, the p-side electrode 15a corresponds to the laser oscillator 20a, the p-side electrode 15b to the laser oscillator 20b, the p-side electrode 15c to the laser oscillator 20c and the p-side electrode 15d to the laser oscillator 20d. The p-side electrodes 15a, 15b, 15c and 15d respectively have a configuration in which, for example, a titanium (Ti) layer of 50 nm in thickness, a platinum (Pt) layer of 100 nm in thickness and an aurum (Au) layer of 300 nm in thickness are laminated from the cap layer 24 side in order before alloying them by heat treatment.

Further, the p-side electrode 15a is extended to cover the extract portion 13a provided adjacent to the corresponding laser oscillator 20a while being formed with the same material as the power source connecting portion 14a provided in the extract portion 13a. The p-side electrode 15d is, like the p-side electrode 15a, extended to cover the extract portion 13b provided adjacent to the corresponding laser oscillator 20d while being formed with the same material as the power source connecting portion 14d provided in the extract portion 13b. That is, the power source connecting portions 14a and 14d have, like the p-side electrodes 15a and 15d, a configuration in which, for example, a titanium layer, a platinum layer and an aurum layer are laminated from the extract portions 13a and 13d side in order before alloying them by heat treatment.

An insulating layer 16a of, for example, 150 nm in thickness made of insulating materials such as silicon nitride (Si$_3$N$_4$) is formed on the p-side electrode 15a. An insulating layer 16b which has the same configuration as the insulating layer 16a is formed on the p-side electrode. 15d as well. Openings 16c for exposing the power source connecting portions 14a and 14d are respectively formed in the insulating layers 16a and 16b.

An extract electrode 17a which is electrically connected to the p-side electrode 15b by being corresponded is formed on the p-side electrode 15b. The extract electrode 17a is extended towards the closer extract portion 13a while being formed with the same material as the power source connecting portion 14b provided in the extract portion 13a. The portion of the extract electrode 17a, which is extended towards the extract portion 13a, is formed respectively with the p-side electrode 15a and the insulating layer 16a in between.

An extract electrode 17b which is electrically connected to the p-side electrode 15c by being corresponded is formed, like the p-side electrode 15b, on the p-side electrode 15c. The extract electrode 17b is extended towards the extract portion 13b while being formed with the same material as the power source connecting portion 14c. The portion of the extract electrode 17b, which is extended towards the extract portion 13b, is formed respectively with the p-side electrode 15d and the insulating layer 16b in between.

The extract electrodes 17a and 17b are respectively formed with metal with high thermal conductivity such as aurum and formed thick so that heat can be actively radiated. That is, the extract electrodes 17a and 17b have a function as the radiation layers which radiate the heat generated in each of the laser oscillators 20a, 20b, 20c and 20d. The thickness of the extract electrode 17a and 17b is preferable to be thick so as to obtain a high radiation effect. Specifically, a thickness of 0.5 µm is preferable and 1 µm is more preferable.

Further, the extract electrode 17a is made to cover the whole surface of the laser oscillator 20b with the p-side electrode 15b in between, while the other portion is made to cover the whole surface of the laser oscillator 20a with the insulating layer 16a and the p-side electrode 15a in between to improve the radiation effect. Like the extract electrode 17a, the extract electrode 17b is made to cover the whole surface of the laser oscillator 20c with the p-side electrode 15c in between, while the other portion is made to cover the whole surface of the laser oscillator 20d with the insulating layer 16b and the p-side electrode 15d in between.

Further, the power source connecting portion 14b is formed with the same material as the extract electrode 17a so that it is formed with metal such as aurum like the extract electrode 17a. Further, the power source connecting portion 14c is formed with the same material as the extract electrode 17b so that it is formed with metal such as aurum like the extract electrode 17b.

The semiconductor laser 200 of FIG. 2 further comprises n-side electrodes 18 which are electrically connected to each of the laser oscillators 20a, 20b, 20c and 20d on one surface side facing the other surface side of the substrate 11. The n-side electrode 18 has a configuration in which, for example, an alloy layer of aurum and germanium (Ge) of 150 nm in thickness, a nickel (Ni) layer of 50 nm in thickness and an aurum layer of 500 nm in thickness are laminated from the substrate 11 side in order before alloying them by heat treatment.

The n-side electrode 18 is, as shown in FIG. 2, electrically connected to a contact electrode 81 which is formed in the base 80 with an adhesion layer 82 in between. That is, the semiconductor laser 200 has a configuration in which the substrate 11 is supported by the base 80 and each of the laser oscillators 20a, 20b, 20c and 20d are respectively formed on the opposite side of the base 80 of the substrate 11. The base 80 is for supporting the substrate 11 and formed with, for example, aluminum nitride of 150 $\mu$m in thickness. The contact electrode 81 is formed with aurum and so on, and the adhesion layer 82 is formed with solder (alloy of lead and tin).

The semiconductor laser having such a configuration can be manufactured as follows.

Figure 4:
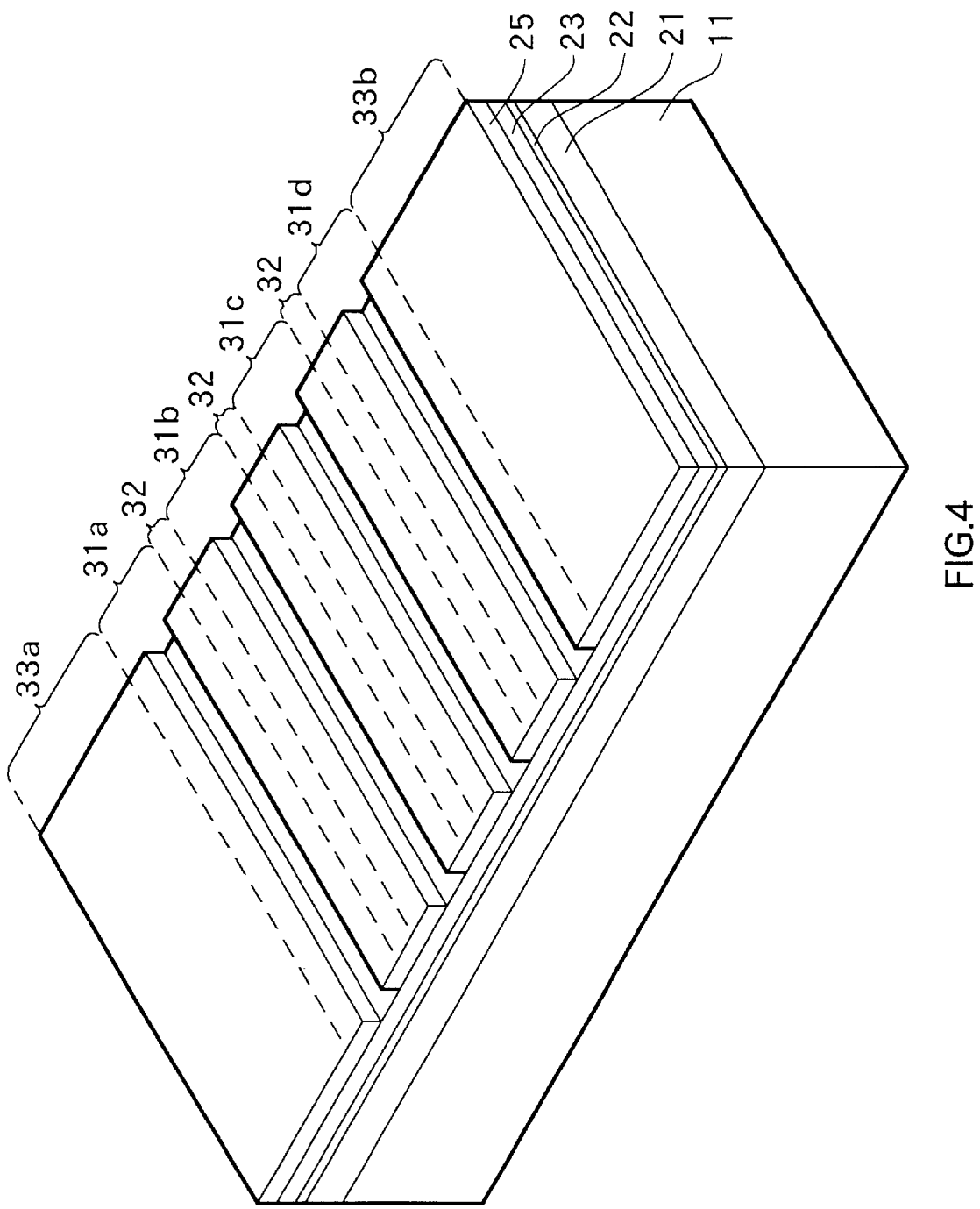
FIG. 4 is a perspective view showing a procedure of manufacturing the semiconductor laser shown in FIG. 2.

FIG. 4 to FIG. 10 show each of the manufacturing procedures. First, as shown in FIG. 4, the substrate 11 formed with n-type GaAs of 350 $\mu$m in thickness is provided. Further, an n-type clad layer 21 formed with n-type AlGaAs mixed crystal, an active layer 22 formed with i-AlGaAs mixed crystal and a p-type clad layer 23 formed with p-type AlGaAs mixed crystal are deposited in one surface (100 plane) side of the substrate 11 in order by MOCVD (Metal Organic Chemical Vapor Deposition) method.

Next, as shown in FIG. 4, the n-type GaAs is deposited on the p-type clad layer 23 by, for example, MOCVD method before forming a current blocking layer 25 through selectively removing the n-type GaAs layer according to laser oscillator forming current narrowing portions 23a, 23b, 23c, and 23d as part of regions 31a, 31b, 31c and 31d by, for example, reactive ion etching (RIE) method.

Next, as shown in FIG. 4, the n-type GaAs is deposited on the p-type clad layer 23 by, for example, MOCVD method before forming a current blocking layer 25 through selectively removing the n-type GaAs layer according to laser oscillator forming regions 31a, 31b, 31c and 31d by, for example, reactive ion etching (RIE) method.

Further, there are forming regions of a plurality of semiconductor lasers on one surface side of the substrate 11, however, a region corresponding to one semiconductor laser is represented to be shown in the figure of each procedure (same in other embodiments). By the way, a forming region of one semiconductor laser includes the laser oscillator forming regions 31a, 31b, 31c and 31d, three separation regions 32 placed between each of the laser oscillator forming regions 31a, 31b, 31c and 31d, an extract portion forming region 33a placed adjacent to the opposite side of the separation region 32 of the laser oscillator forming region 31a and an extract portion forming region 33b placed adjacent to the opposite side of the separation region 32 of the laser oscillator forming region 31d.

Figure 5:
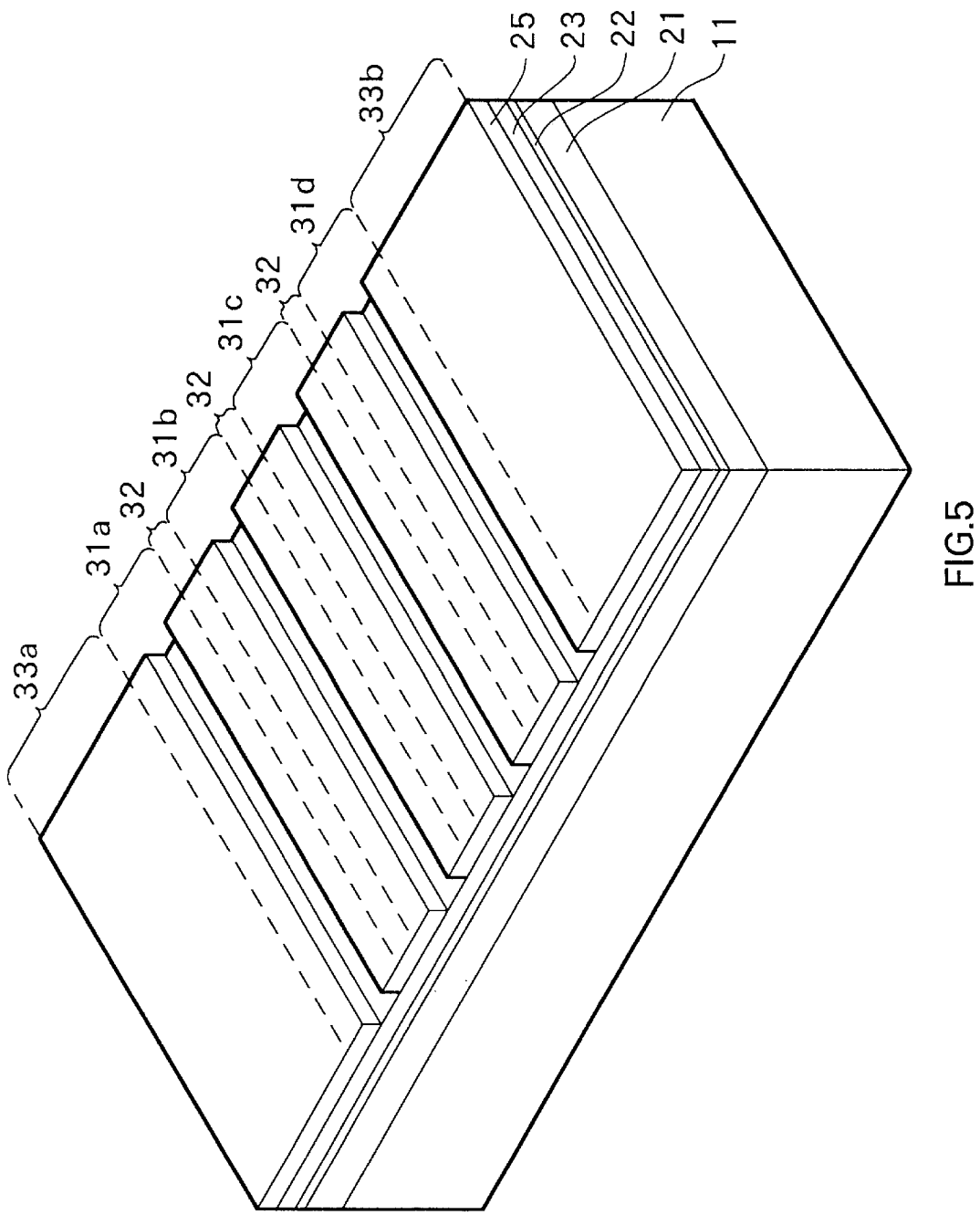
FIG. 5 is a perspective view showing a manufacturing procedure following FIG. 4.

Further, as shown in FIG. 5, an addition to the p-type clad layer 23 formed with p-type AlGaAs mixed crystal and then a cap layer 24 formed with p-type GaAs mixed crystal are deposited on the exposed current blocking layer 25 and the exposed p-type clad layer 23 in order by, for example, MOCVD method. Afterwards, zinc 15 is diffused onto the cap layer 24 so that the cap layer 24 and the p-side electrodes 15a, 15b, 15c and 15d eventually formed on it will be in a state of ohmic contact.

Figure 6:
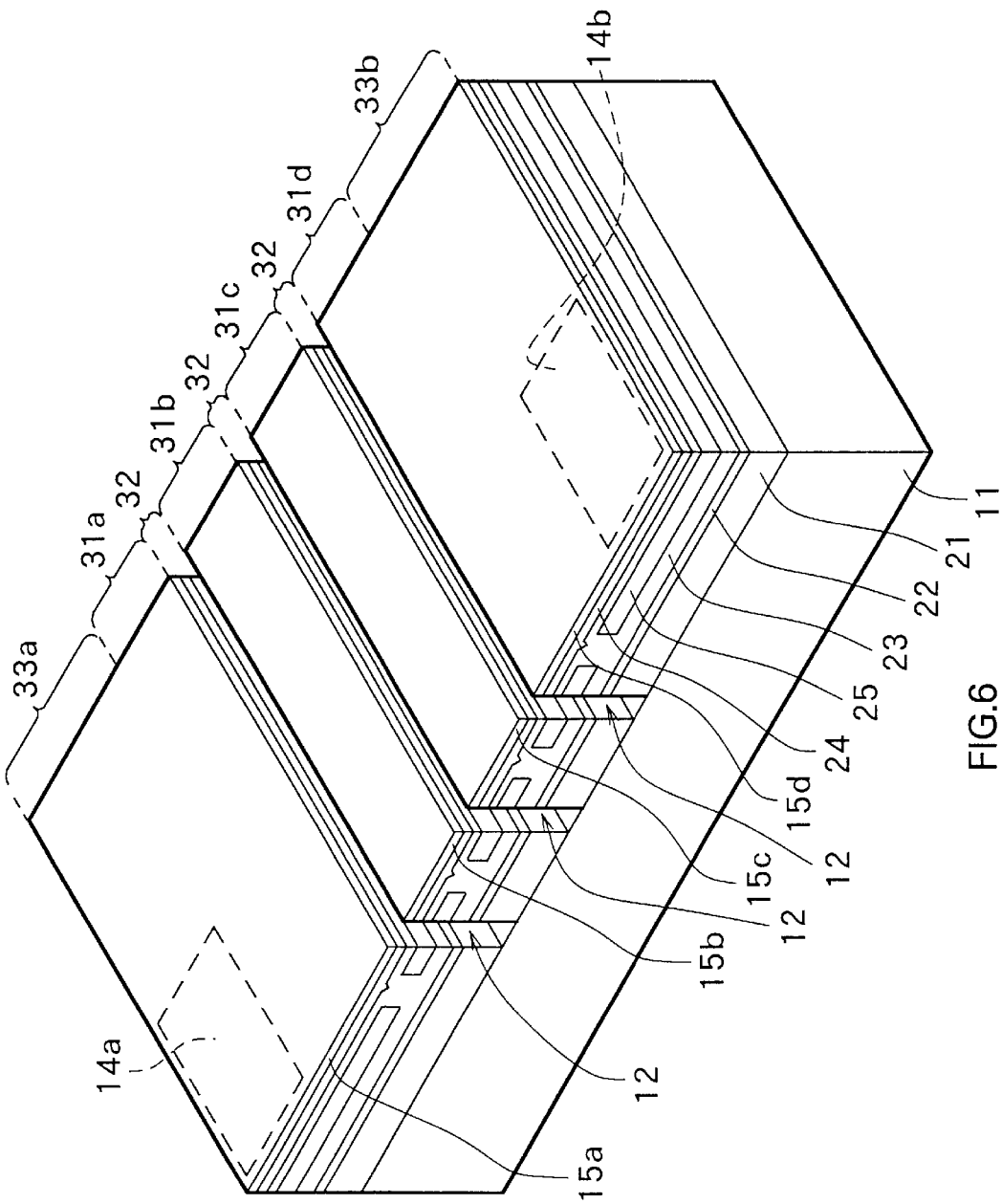
FIG. 6 is a perspective view showing a manufacturing procedure following FIG. 5.

After diffusing zinc 15, as shown in FIG. 6, a photoresist film (not shown in figure) is selectively formed by corresponding to each of the separation regions 32 on the cap layer 24. Further, the photoresist film (not shown in figure) is removed (lift-off process) by evaporating, for example, a titanium layer, a platinum layer and an aurum layer on the photoresist film (not shown in figure) in order. Accordingly, the p-side electrode 15a is formed by corresponding to the extract portion forming region 33a and the laser oscillator forming region 31a, the p-side electrodes 15b and 15c are formed by corresponding to the laser oscillator forming regions 31b and 33c, and the p-side electrode 15d is formed by corresponding to the laser oscillator forming region 31d and the extract portion forming region 33b. Further, at this time, the power source connecting portion 14a is defined or formed with the same material as the p-side electrode 15a in part of the extract portion forming region 33a while the power source connecting portion 14d is formed with the same material as the p-side electrode 15d in part of the extract portion forming region 33b.

Afterwards, as shown in FIG. 6, each of the separation grooves 12 corresponding to each of the separation regions 32 are respectively formed through selectively removing each of the cap layer 24, the p-type clad layer 23, the current blocking layer 25, the active layer 22 and the n-type clad layer 21 by, for example, RIE method using the p-type electrodes 15a, 15b, 15c and 15d as a mask. As a result, the n-type clad layer 21, the active layer 22, the p-type clad layer 23 and the cap layer 24 are respectively separated according to the laser oscillator potion forming regions 31a, 31b, 31c and 31d. Here, separation of those is performed using the p-side electrodes 15a, 15b, 15c and 15d directly as a mask so that no lithography is required and separation with high precision can be performed through less procedure. Further, of course, they may be separated by selectively forming a photoresist film on each of the p-side electrodes 15a, 15b, 15c and 15d through lithography without using the p-side electrodes 15a, 15b, 15c and 15d as a mask and etching it by RIE method using the photoresist film as a mask.

Figure 7:
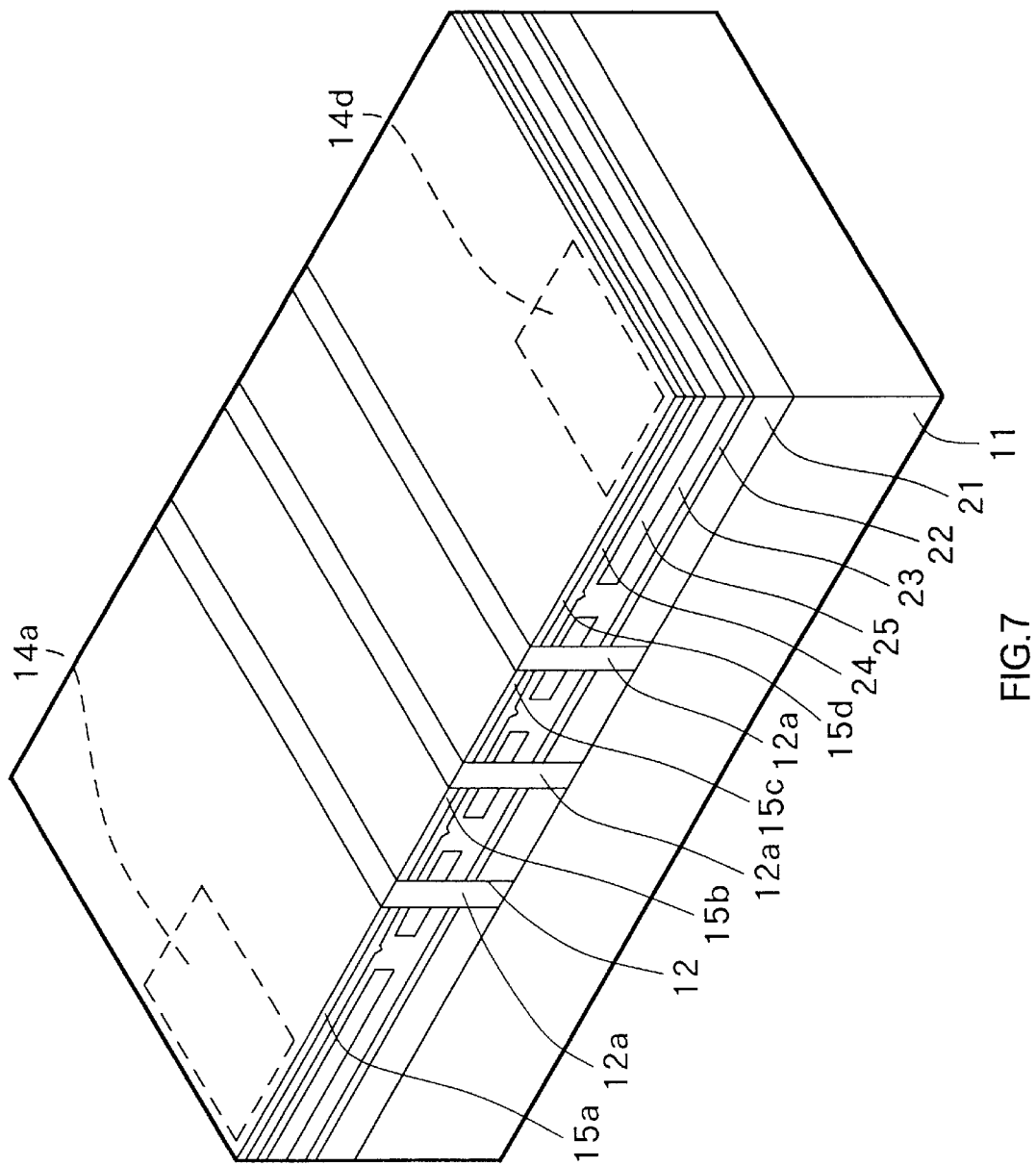
FIG. 7 is a perspective view showing a manufacturing procedure following FIG. 6.
Figure 8:
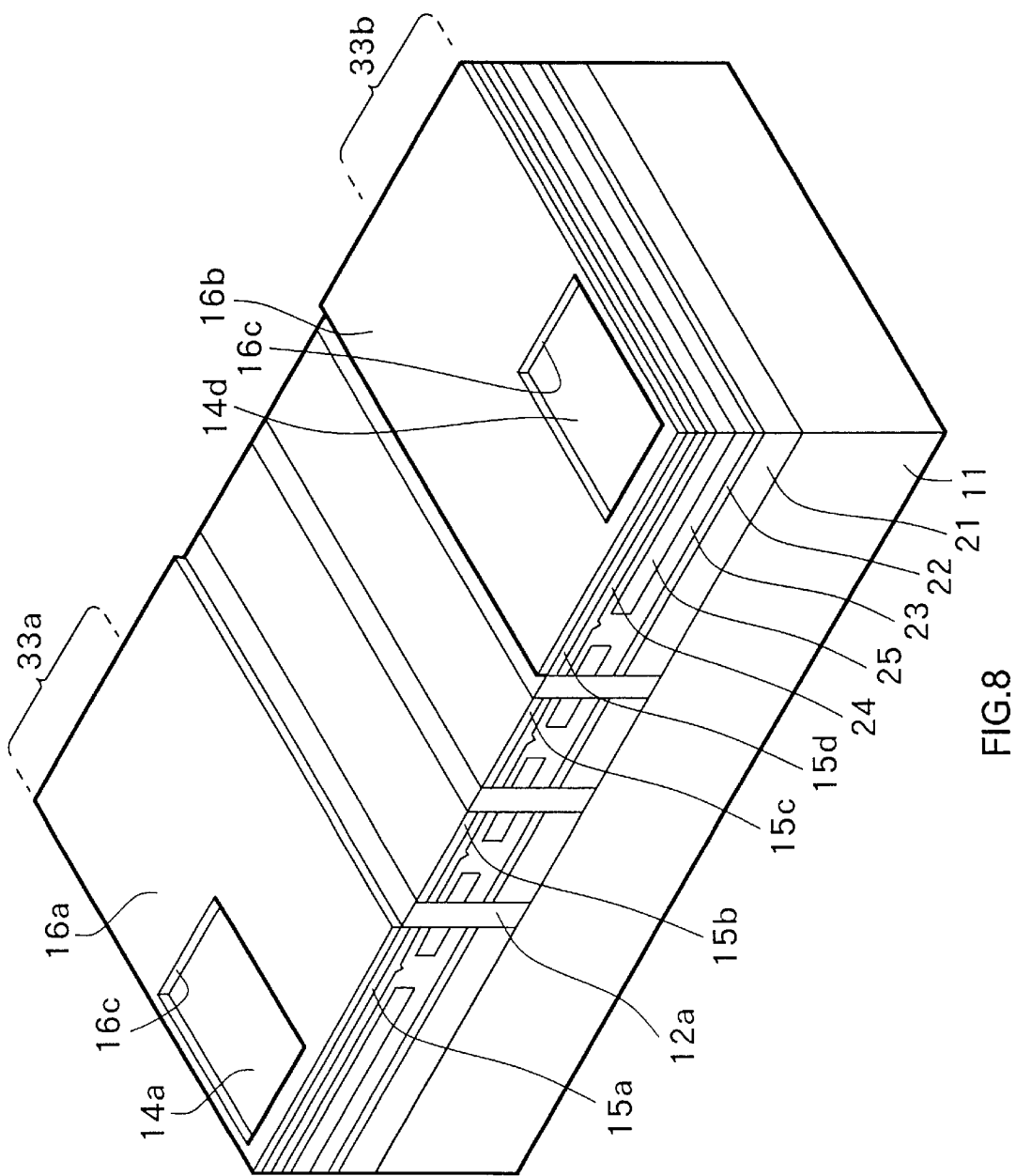
FIG. 8 is a perspective view showing a manufacturing procedure following FIG. 7.

After forming each of the separation grooves 12, as shown in FIG. 7, the embedding layers 12a formed with, for example, polyimide are respectively embedded into each of the separation grooves 12. As a result, the surface is flattened. Then, as shown in FIG. 8, a silicon nitride layer is formed all over the surface on the p-side electrodes 15a, 15b, 15c and 15d and the silicon nitride layer is selectively removed by, for example, RIE method. As a result, the insulating layer 16a is formed on the surface of the p-side electrode 15a while the insulating layer 16b is formed on the surface of the p-side electrode 15d. Further, at the time of etching, openings 16c are respectively formed in part of the extract portion forming regions 33a and 33b, and the power source connecting portions 14a and 14d are respectively exposed.

After forming each of the separation grooves 12, as shown in FIG. 7, the embedding layers 12a formed with, for example, polyimide are respectively embedded into each of the separation grooves 12. As a result, the top most exposed surface is flattened. Then, as shown in FIG. 8, a silicon nitride layer is formed all over the surface on the p-side electrodes 15a, 15b, 15c and 15d and the silicon nitride layer is selectively removed by, for example, RIE method. As a result, the insulating layer 16a is formed on the surface of the p-side electrode 15a while the insulating layer 16b is formed on the surface of the p-side electrode 15d. Further, at the time of etching, openings 16c are respectively formed in part of the extract portion forming regions 33a and 33b, and the power source connecting portions 14a and 14d are respectively exposed.

Figure 9:
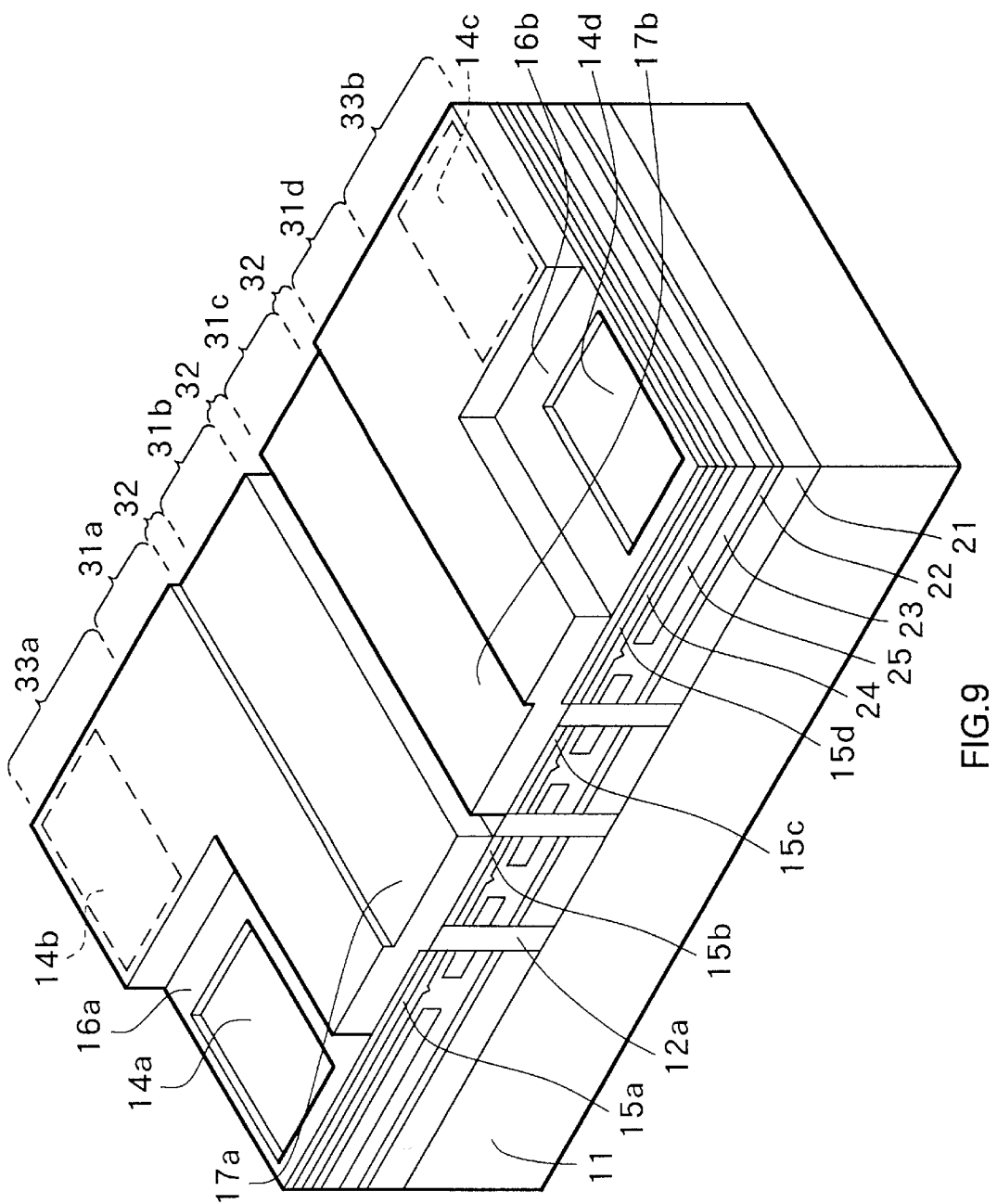
FIG. 9 is a perspective view showing a manufacturing procedure following FIG. 8.

After forming each of the insulating layers 16a and 16b, as shown in FIG. 9, a photoresist film (not shown in figure) is selectively formed by corresponding to the separation region 32 (now region 32') between the laser oscillator forming regions 31b and 31c, and the power source connecting portions 14a and 14d. Further, the photoresist film (not shown in figure) is removed (lift-off process) by evaporating a metal layer made of, for example, aurum onto it. As a result, an extract layer 17a is formed from the laser oscillator forming region 31b to laser oscillator forming region 31a and part of the extract portion forming region 33a while an extract layer 17b is formed from the laser oscillator forming region 31c to the laser oscillator forming region 31d and part of the extract portion forming region 33b. Further, at this time, the power source connecting portion 14b with the same material as the extract electrode 17a is defined or formed in part of the extract portion forming region 33a while the power source connecting portion 14c is formed with the same material as the extract electrode 17b is formed in part of the extract portion forming region 33b.

Figure 10:
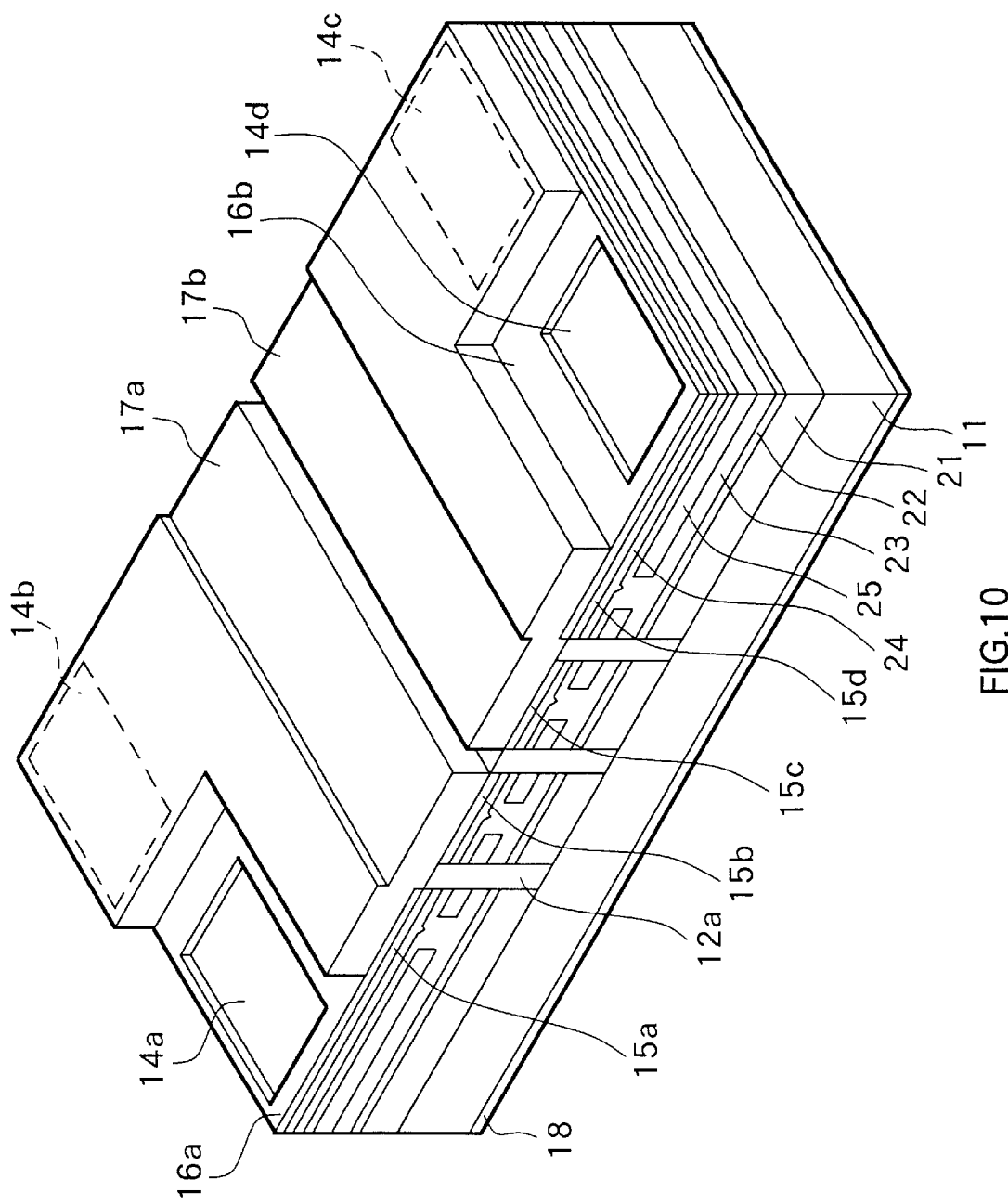
FIG. 10 is a perspective view showing a manufacturing procedure following FIG. 9.

After respectively forming the extract electrodes 17a and 17b, as shown in FIG. 10, one surface side of the substrate 11 is lapped so as to have its thickness, for example, 100 μm in order to make cleavage of the substrate performed in the procedure which is to be described later easier. Further, n-side electrode 18 is formed on the other surface side by evaporating, for example, an alloy layer of aurum and germanium, a nickel layer and an aurum layer in order. Then, in FIG. 11, the p-side electrodes 15a, 15b, 15c and 15d and n-side electrode 18 are respectively alloyed by applying heat treatment.

Figure 11:
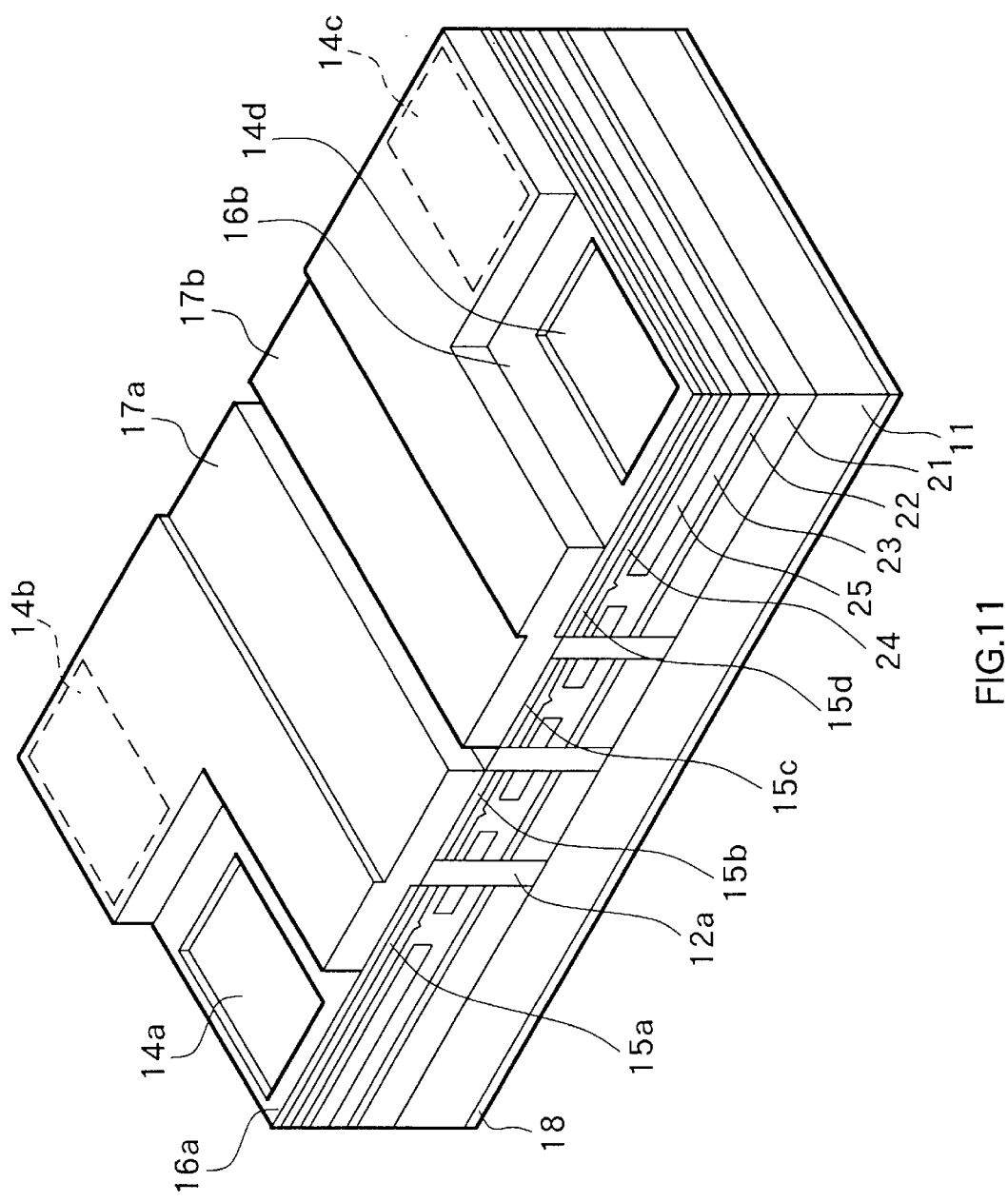
FIG. 11 is a perspective view showing a configuration of the semiconductor laser according to the second embodiment of the invention.

After applying heat treatment, however not shown in FIG. 11, the substrate 11 is made corresponded to the forming regions 33a and 33b of each semiconductor laser, which are respectively cleaved in the resonator direction A and a direction vertical to it. Then, edge surface films 26 and 27 are formed against a pair of the side surface located in an edge of the resonator direction A by, for example, CVD method. After respectively forming the edge surface films 26 and 27, the substrate 11 is provided on the base 80 (FIG. 2) through connecting the contact electrode 81 formed in the base 80 and the n-side electrode 18 by the adhesion layer 82. As a result, the semiconductor laser shown in FIG. 2 can be formed.

The semiconductor laser manufactured as described operates as follows.

In the semiconductor laser of FIG. 2 and FIG. 3, when power of the power source connecting portions 14a, 14b, 14c, 14d and the contact electrode 81 is on, predetermined voltage is applied between the p-side electrodes 15a, 15b, 15c, 15d and the n-side electrode 18. As a result, current flows into the active layer 22 in the laser oscillators 20a, 20b, 20c and 20d so that light emission by electron-hole recombination occurs respectively. The light generated in the laser oscillators 20a, 20b, 20c and 20d is amplified by going back and forth between a pair of the edge surface films 26 and 27 of FIG. 3 and respectively emitted outside from the edge surface film 26 at, for example, extraction portions 13a and 13b.

Further, at this time, generation of heat occurs respectively in the laser oscillators 20a, 20b, 20c and 20d. However, here, the generated heat is actively radiated through the extract electrodes 17a and 17b since the extract electrode 17a having a function as a radiation layer is provided by corresponding to the laser oscillators 20a and 20b, and the extract electrode 17b having a function as a radiation layer is provided by corresponding to the laser oscillators 20c and 20d. As a result, increase of threshold current and deterioration of luminous efficacy are suppressed.

According to the embodiment as described, heat generated in the laser oscillators 20a, 20b, 20c and 20d can be actively radiated through the extract electrodes 17a and 17b since the extract electrodes 17a and 17b having a function as a radiation layer are made to be provided. Accordingly, thermal interference can be eliminated and increase of threshold current and deterioration of luminous efficacy can be suppressed even in a case where the substrate 11 is placed with the opposite side of the laser oscillators 20a, 20b, 20c and 20d facing the base 80. As a result, manufacturing of the semiconductor laser becomes easy and mass production becomes possible while maintaining high quality for a long period of time.

Further, according to the embodiment, each of the separation grooves 12 can be precisely separated through less procedure since etching is performed using each of the p-side electrodes 15a, 15b, 15c and 15d as a mask when respectively forming each of the separation grooves 12 by selectively removing the n-type clad layer 21, the active layer 22, the p-type clad layer 23 and the cap layer 24 laminated on the substrate 11. Accordingly, manufacturing procedure can be simplified and manufacturing cost can be lowered.

Second Embodiment

Figure 12:
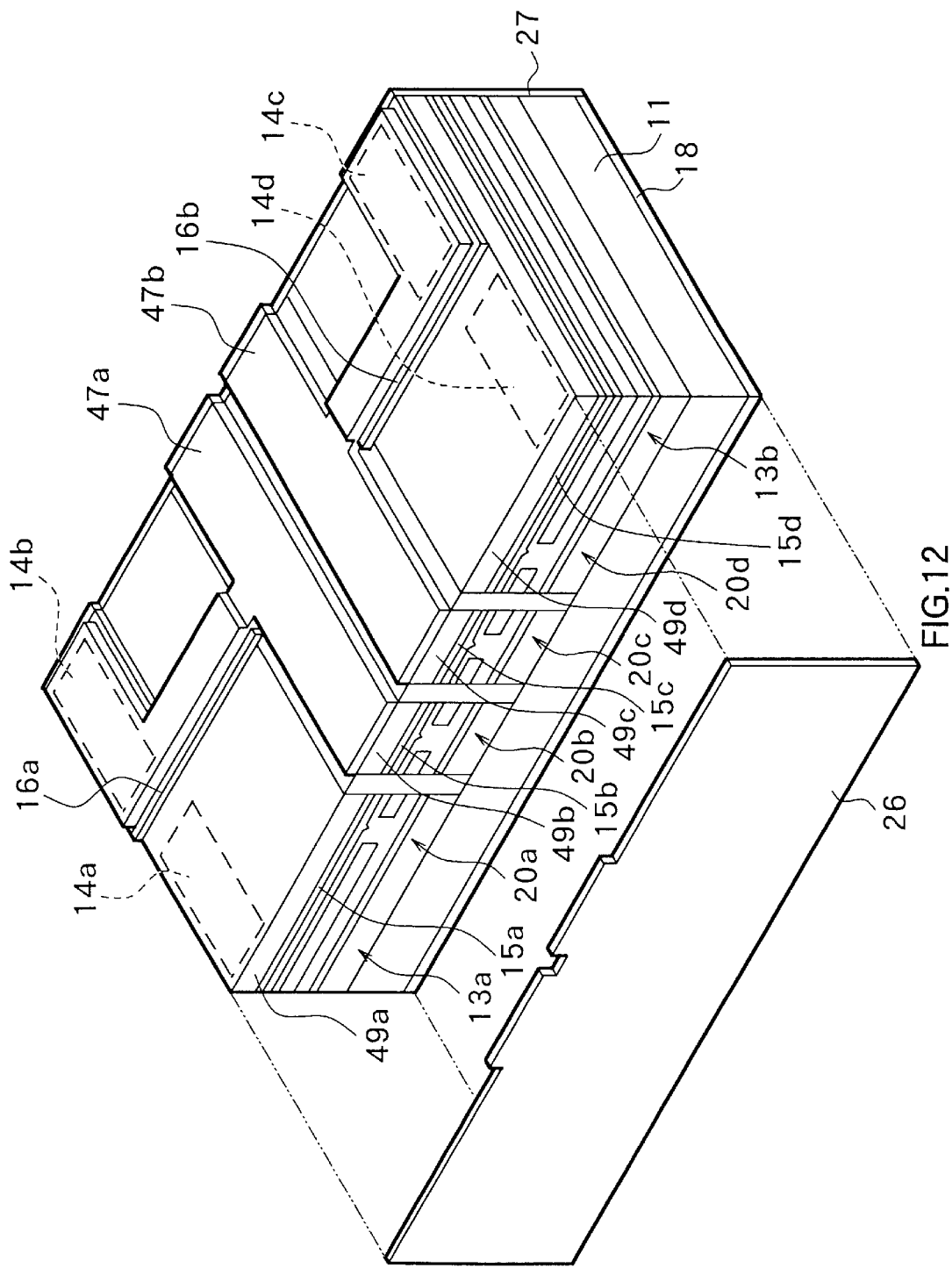
FIG. 12 is a perspective view showing a procedure of manufacturing the semiconductor laser shown in FIG. 11.

FIG. 12 shows a disassembled configuration of the semiconductor laser according to a second embodiment of the invention. The semiconductor laser 300 has the same configuration, operation and effects as those of the first embodiment in FIG. 3 except that it comprises each of the radiation layers 49a, 49b, 49c and 49d besides the extract electrodes 47a and 47b which do not have a function as a radiation layer. Accordingly, here, like numerals are adopted to the identical structural elements and the detailed description is omitted. Further, like the first embodiment, the substrate 11 is supported by the base 80 and the laser oscillators 20a, 20b, 20c and 20d are respectively formed on the opposite side (that is, one surface) of the base 80 of the substrate 11 in the semiconductor laser, however, the base 80 is omitted in FIG. 12.

The radiation layers 49a, 49b, 49c and 49d are respectively formed to cover each of the laser oscillators 20a, 20b, 20c and 20d on the p-side electrodes 15a, 15b, 15c and 15d by being corresponded. Here, the radiation layer 49a corresponds to each of the p-side electrode 15a and the laser oscillator 20a, the radiation layer 49b to each of the p-side electrode 15b and the laser oscillator 20b, the radiation layer 49c to each of the p-side electrode 15c and the laser oscillator 20c, and the radiation layer 49d to each of the p-side electrode 15d and the laser oscillator 20d.

The radiation layers 49a, 49b, 49c and 49d are respectively formed with metal such as aurum having high thermal conductivity and electrically connected to each of the corresponding p-side electrodes 15a, 15b, 15c and 15d. Further, thickness of the radiation layers 49a, 49b, 49c and 49d are made thick in order to actively radiate heat. The thickness is preferable to be thicker so that high radiation effect can be obtained. Specifically, a thickness of 0.5 μm or more is preferable, and 1.0 μm or more is more preferable.

Further, the radiation layer 49a is extended to cover the extract portion 13a like the p-side electrode 15a and formed mutually with the same material as the power source connecting portion 14a. The radiation layer 49d is extended to cover the extract portion 13b like the p-side electrode 15d and formed mutually with the same material as the power source connecting portion 14d. That is, here, the power source connecting portions 14a and 14d have the same configuration as the p-side electrodes 15a, 15d, and the radiation layers 49a, 49d being laminated.

The extract electrode 47a is electrically connected to the p-side electrode 15b through the radiation layer 49b while part of which being extended towards the extract portion 13a is formed with the p-side electrode 15a, the radiation layer 49a and the insulating layer 16a in between, respectively. The extract electrode 47b, like the extract layer 47a, is electrically connected to the p-side electrode 15c through the radiation layer 49c while part of which being extended towards the extract portion 13b is formed with the p-side electrode 15d, the radiation layer 49d and the insulating layer 16b in between, respectively.

Accordingly, here, the power source connecting portion 14b is formed on the extract portion 13a with the p-side electrode 15a, the radiation layer 49a and the insulating layer 16a in between, respectively. The power source connecting portion 14c is formed on the extract portion 13b, with the p-side electrode 15d, the radiation layer 49d and the insulating layer 16b in between, respectively.

Further, the extract electrodes 47a and 47b do not have a function as a radiation layer and whose thickness is, for example, 100 nm which is sufficient to maintain its conductivity. Accordingly, the extract electrodes 47a and 47b are made to cover only part of the radiation layers 49a and 49d in a region corresponding to the laser oscillators 20a and 20d with the insulating layers 16a and 16b in between, respectively, in order not to obstruct the radiation effect of the radiation layers 49a and 49d. The area covering the radiation layers 49a and 49d in a region corresponding to the laser oscillators 20a and 20d is preferable to be as small as possible so that higher radiation effect can be obtained.

The semiconductor laser 300 having such a configuration can be manufactured as follows.

Figure 13:
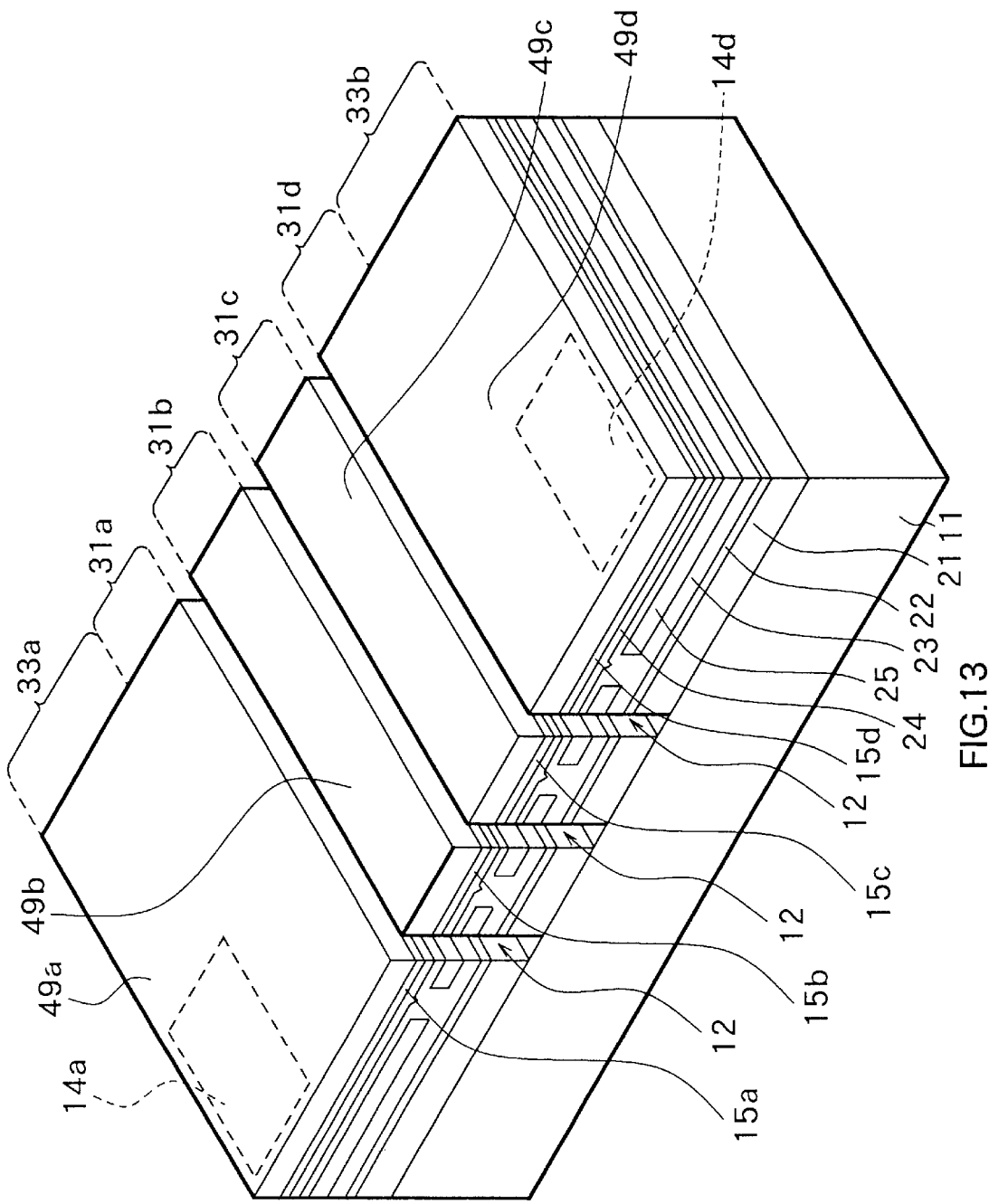
FIG. 13 is a perspective view showing a manufacturing procedure following FIG. 12.
Figure 14:
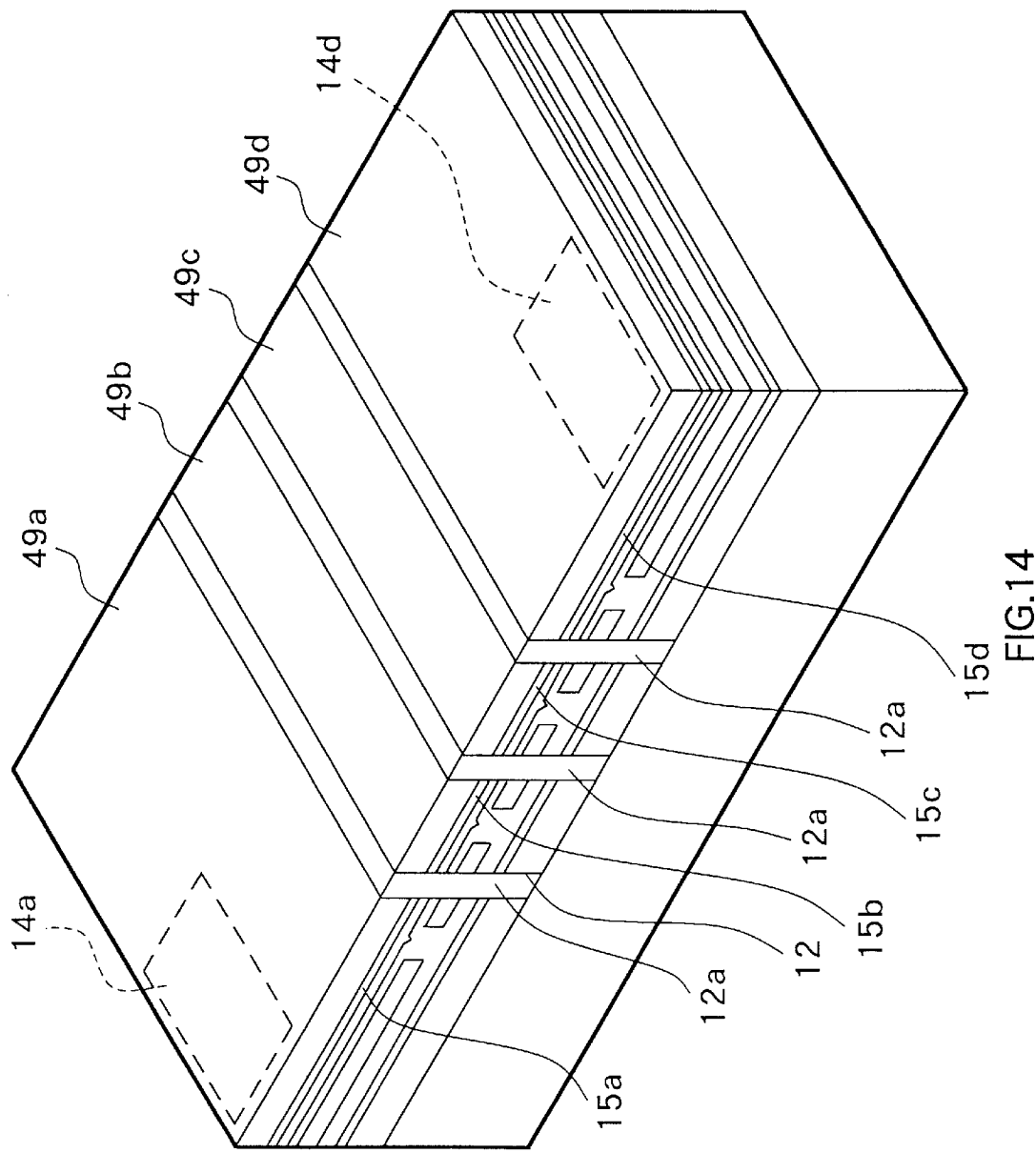
FIG. 14 is a perspective view showing a manufacturing procedure following FIG. 13.
Figure 15:
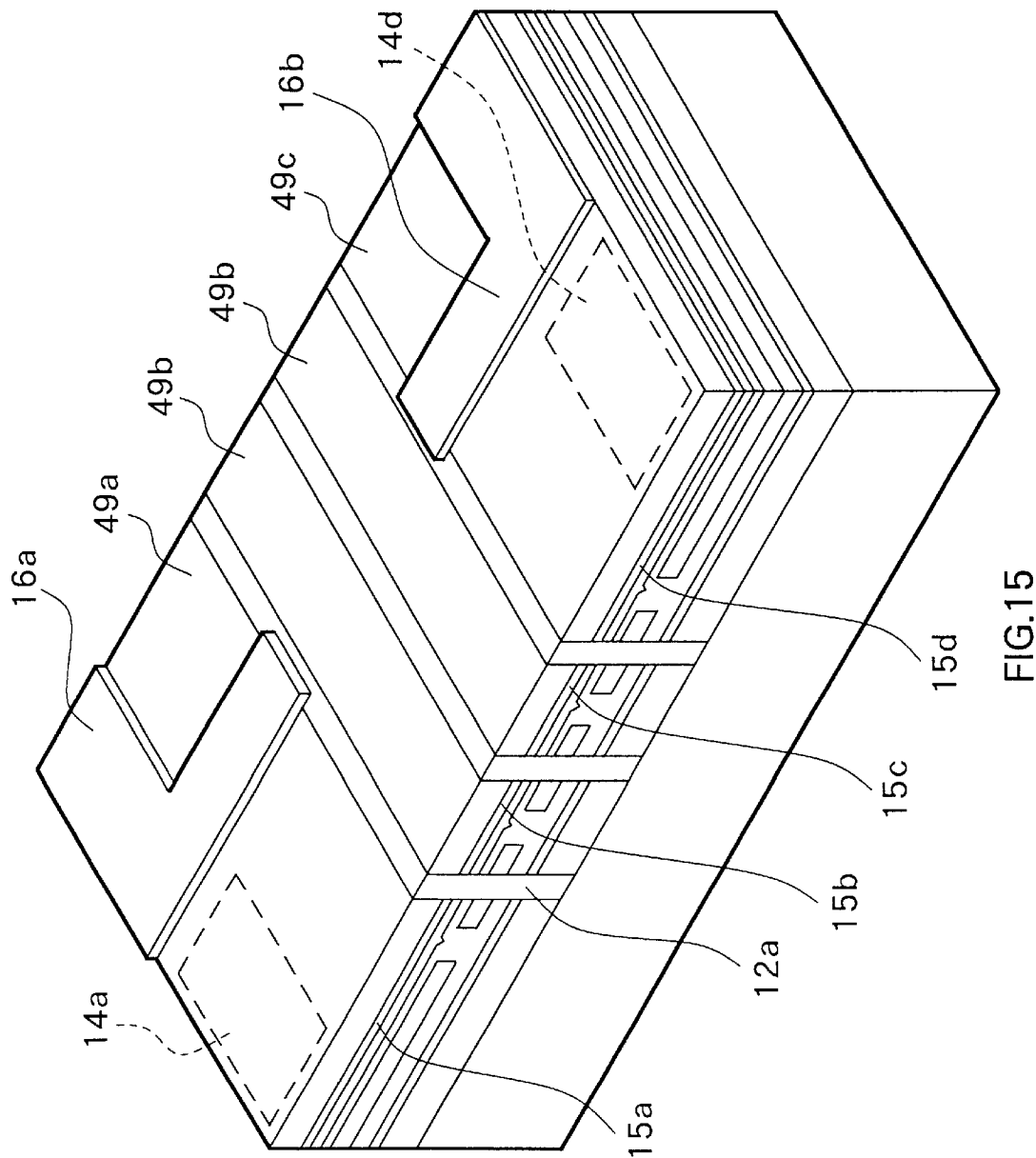
FIG. 15 is a perspective view showing a manufacturing procedure following FIG. 14.

FIG. 13 to FIG. 15 show each of the manufacturing procedures. First, like the first embodiment, the n-type clad layer 21, the active layer 22, the p-type clad layer 23, the current blocking layer 25 and the cap layer 24 are formed on one surface (100 plane) side of the substrate 11 in order, and zinc 15 is diffused onto the cap layer 24 (see FIG. 4 and FIG. 5).

Next, a photoresist film (not shown in figure) is selectively formed on the cap layer 24 by corresponding to each of the separation regions 32 and, for example, a titanium layer, a platinum layer and an aurum layer, which respectively form the p-side electrodes 15a, 15b, 15c and 15d are evaporated onto it in order (FIG. 6). Further, in FIG. 13, an aurum layer made of such as aurum which forms each of the radiation layers 49a, 49b, 49c and 49d is evaporated onto it so as to remove (lift-off process) the photoresist film (not shown in figure).

As a result, as shown in FIG. 13, the p-side electrode 15a and the radiation layer 49a are formed by being laminated by corresponding to the extract portion forming region 33a and the laser oscillator forming region 31a, the p-side electrode 15b and the radiation layer 49b are formed by being laminated by corresponding to the laser oscillator forming region 31b, the p-side electrode 15c and the radiation layer 49c are formed by being laminated by corresponding to the laser oscillator forming region 33c and the p-side electrode 15d and the radiation layer 49d are formed by being laminated by corresponding to the laser oscillator forming region 31d and the extract portion forming region 33b. Further, at this time, the power source connecting portion 14a made of the same material as the p-side electrode 15a and the radiation layer 49a is defined or formed in part of the extract portion forming region 33a while the power source connecting portion 14d made of the same material as the p-side electrode 15d and the radiation layer 49d is defined or formed in part of the extract portion forming region 33b.

Further, as shown in FIG. 13, like the first embodiment at FIG. 6, each of the separation grooves 12 are respectively formed by selectively removing each of the cap layer 24, the p-type clad layer 23, the current blocking layer 25, the active layer 22 and the n-type clad layer 21.

After respectively forming each of the separation grooves 12, as shown in FIG. 14, like the first embodiment at FIG. 7, the embedding layers 12a are respectively embedded to each of the separation grooves 12. Then, as shown in FIG. 15, like the first embodiment at FIG. 8, the insulating layer 16a is selectively formed on the surface of the radiation layer 49a and the surface of the adjacent embedding layer 12a while the insulating layer 16b is formed on the surface of the radiation layer 49d and the surface of the adjacent embedding layer 12a.

After respectively forming the insulating layers 16a and 16b, as shown in FIG. 15, the extract electrodes 47a and 47b as seen in FIG. 12 are selectively formed like the first embodiment in FIG. 9. At this time, the power source connecting portion 14b made of the same material as the extract electrode 47a is defined or formed in part of the extract electrode 47a while the power source connecting portion 14c made of the same material as the extract electrode 47b is defined or formed in part of the extract electrode 47b.

After respectively forming the extract electrodes 47a and 47b as in FIG. 12, the other surface side of the substrate 11 is lapped and the n-side electrode 18 is formed on the surface side before applying heat treatment. Then, the edge surface films 26 and 27 are respectively formed by cleaving the substrate 11 by corresponding to the forming region of each of the semiconductor lasers. After respectively forming the edge surface films 26 and 27, the substrate 11 is provided on the base 80 (see FIG. 2) by connecting the contact electrode 81 and the n-side electrode 18 with the adhesion layer 82 in between. Through this procedure, the semiconductor laser 300 shown in FIG. 12 is implemented.

As described, according to the embodiment, the radiation layers 49a, 49b, 49c and 49d can be formed continuously with the p-side electrodes 15a, 15b, 15c and 15d since they are made to be provided by being adjacent to each of the p-side electrodes 15a, 15b, 15c and 15d as in FIG. 13 so as to correspond mutually. As a result, the semiconductor laser 300 can be formed easily without adding the manufacturing procedure for forming a radiation layer.

Third Embodiment

Figure 16:
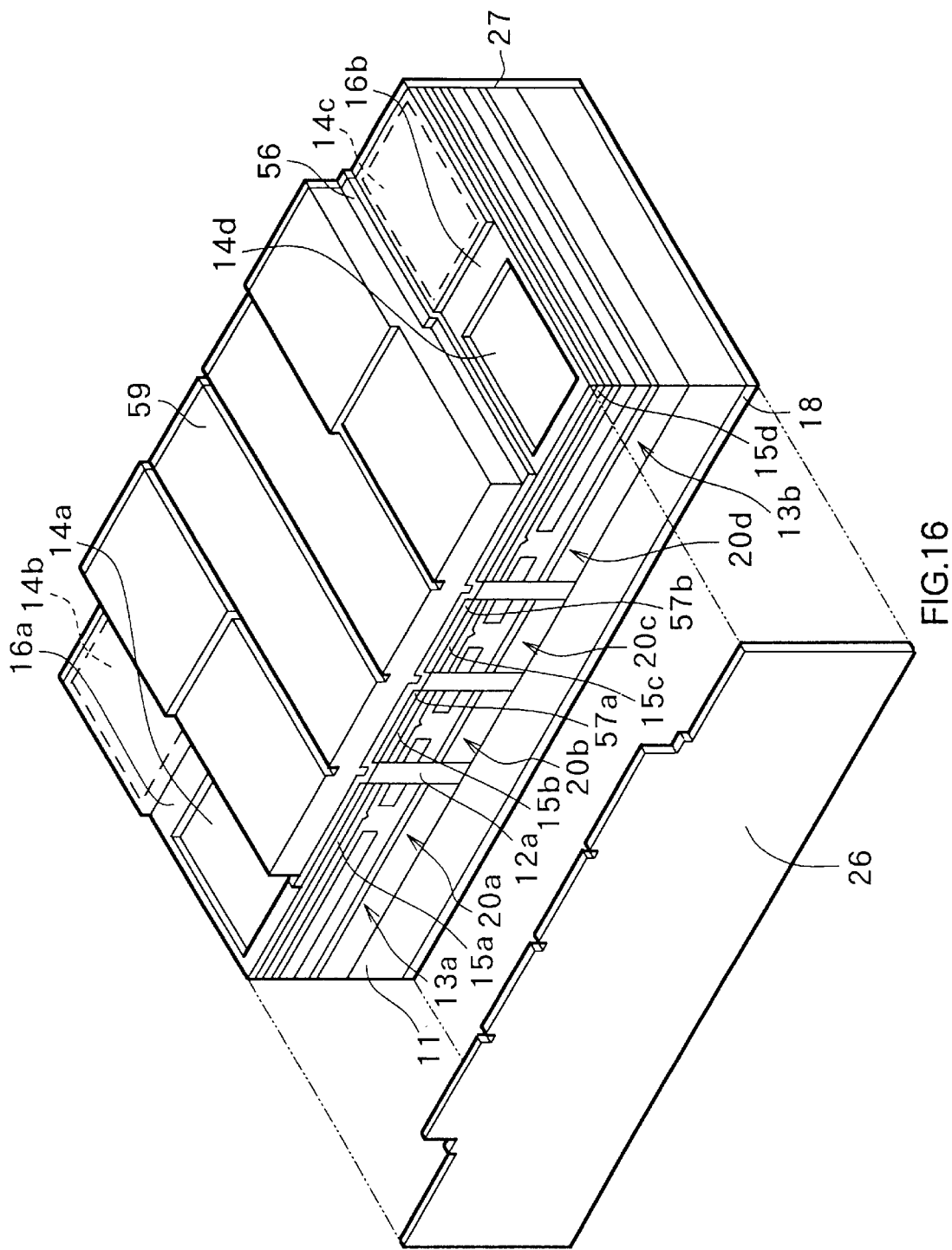
FIG. 16 is a perspective view showing a configuration of the semiconductor laser according to the third embodiment of the invention.

FIG. 16 shows a disassembled configuration of the semiconductor laser according to a third embodiment of the invention. The semiconductor laser 400 has the same configuration, operation and effects as those of the first embodiment except that it comprises a radiation layer 59 besides the extract electrodes 57a and 57b (which do not have a function as a radiation layer). Accordingly, here, like numerals are adopted to the identical structural elements and the detailed description is omitted. Further, like the first embodiment, the substrate 11 is supported by the base 80 (see FIG. 2) and the laser oscillators 20a, 20b, 20c and 20d are respectively formed on the opposite side (that is, one surface) of the base 80 of the substrate 11 in the semiconductor laser, however, the base 80 is omitted in the FIG. 16.

The extract electrodes 57a and 57b do not have a function as a radiation layer and whose thickness is, for example, 100 nm (which is sufficient to maintain its electrical conductivity but insufficient for thermal conductivity needs). Further, the extract electrodes 57a and 57b are required to be extended towards the power source connecting portions 14b and 14c with a width sufficient to maintain electrical connection with the power source connecting portions 14b and 14c but not required to cover the whole surface of the laser oscillators 20a and 20d, respectively.

The radiation layer 59 is formed on the laser oscillators 20a, 20b, 20c and 20d to cover each of them with the p-side electrodes 15a, 15b, 15c, 15d, and the extract electrodes 57a, 57b in between, respectively. The radiation layer 59 is formed with metal such as aurum or material with high thermal conductivity such as aluminum nitride. Further, radiation layer 59 is formed to have a thickness of 0.5 $\mu$m or more, preferably 1 $\mu$m or more, in order to be able to actively radiate heat.

Further, for example, in a case where the radiation layer 59 is formed with dielectric material such as metal, an insulating film 56 made of insulating material such as silicon nitride is formed between the extract electrodes 57a, 57b and the radiation layer 59 so as to maintain insulation characteristic of the extract electrodes 57a and 57b.

The semiconductor laser 400 having such a configuration can be manufactured as follows.

Figure 17:
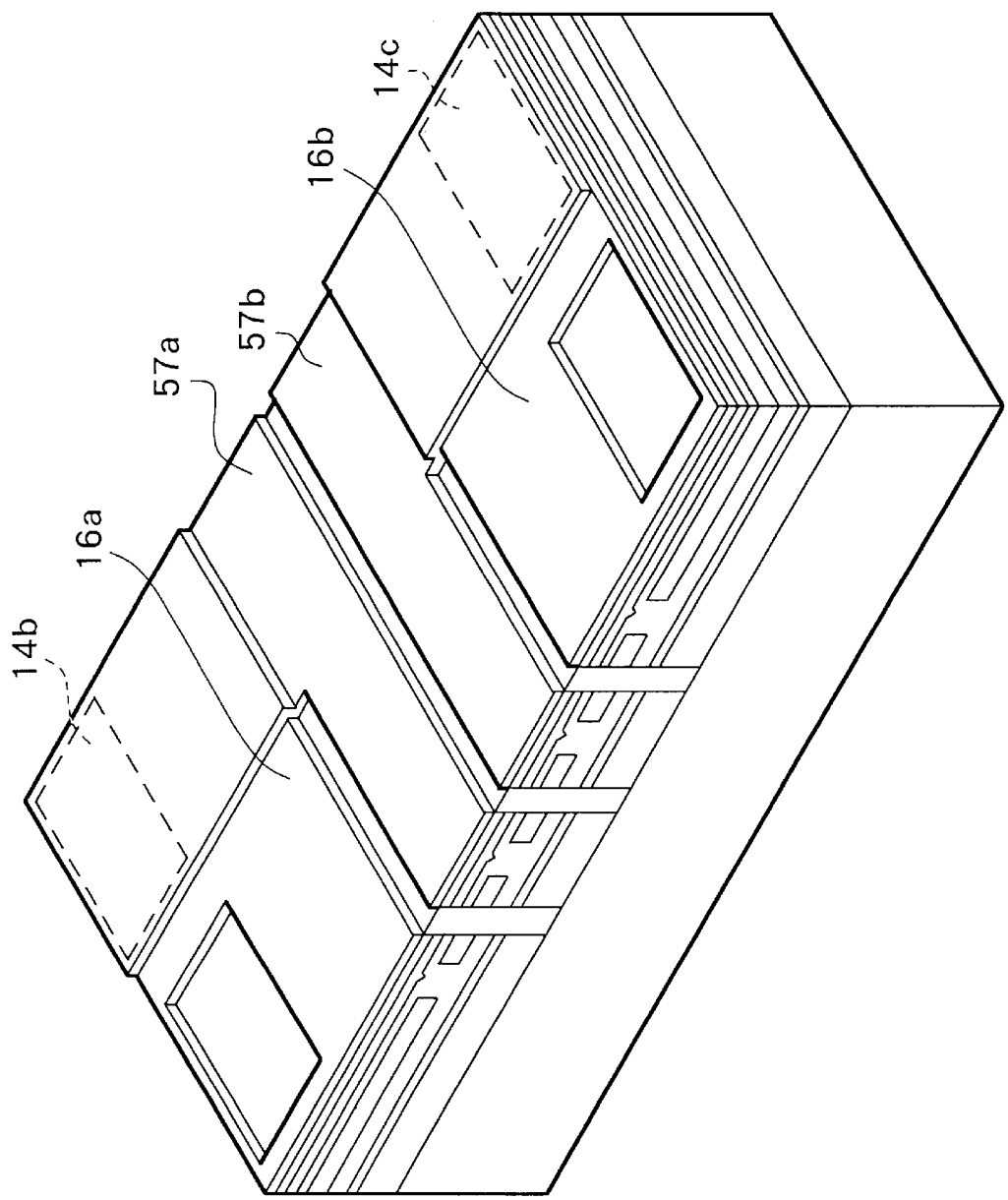
FIG. 17 is a perspective view showing a procedure of manufacturing the semiconductor laser shown in FIG. 16.
Figure 18:
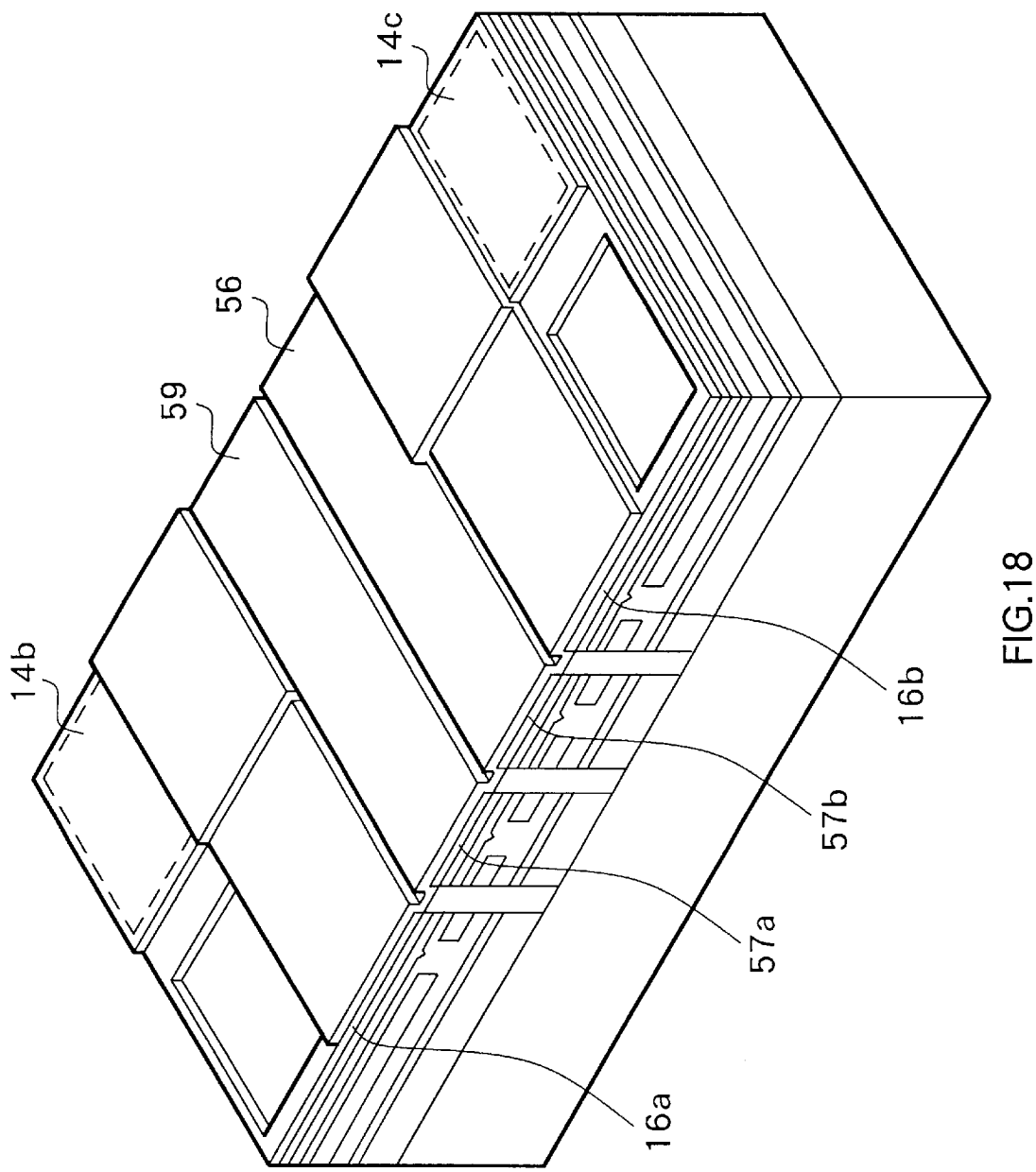
FIG. 18 is a perspective view showing a manufacturing procedure following FIG. 17.
Figure 19:
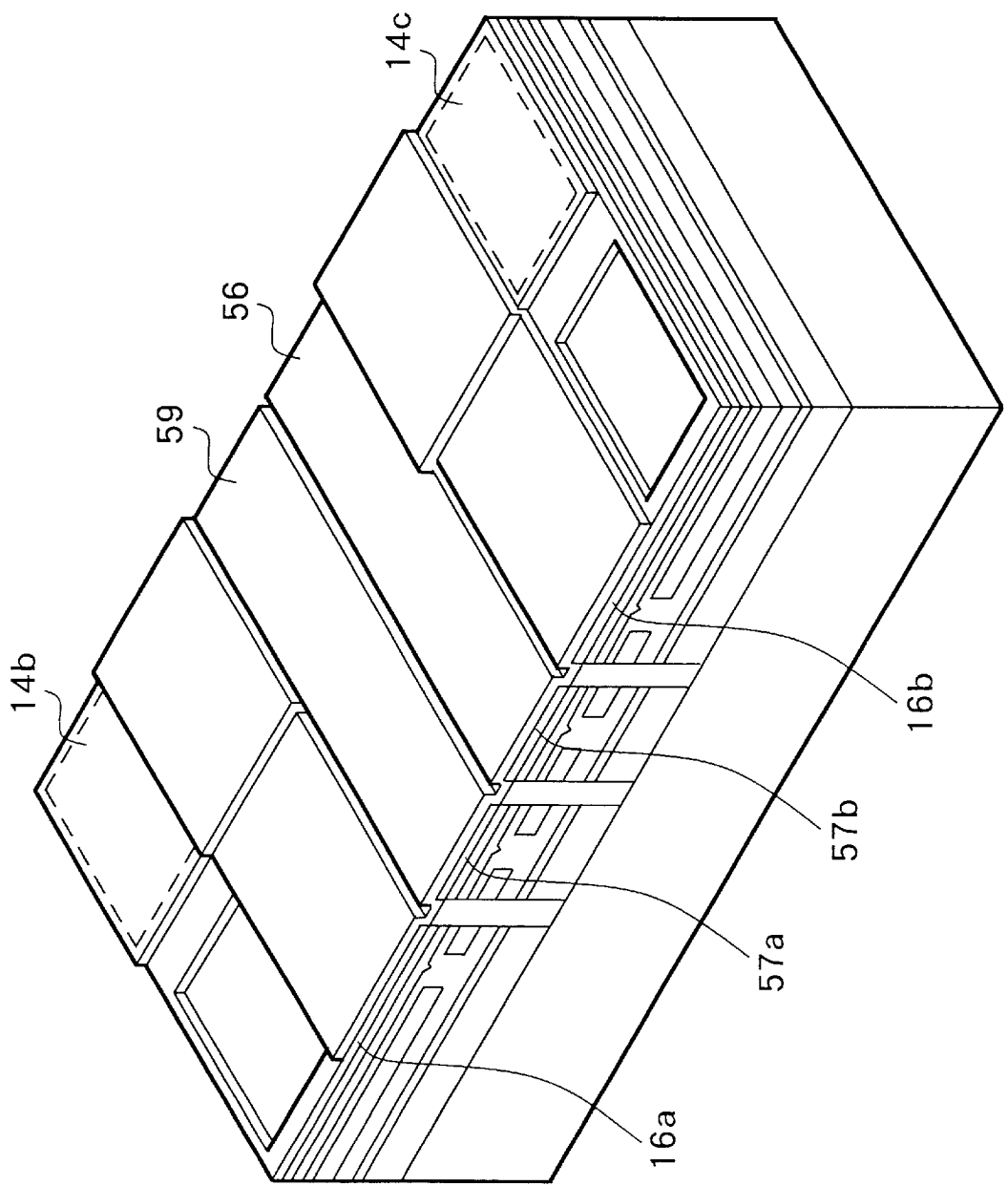
FIG. 19 is a perspective view showing a manufacturing procedure following FIG. 18.

FIG. 17 to FIG. 19 show each of the manufacturing procedures. First, like the first embodiment, the n-type clad layer 21, the active layer 21, the active layer 22, the p-type clad layer 23, the current blocking layer 25 and the cap layer 24 are formed on one surface (100 plane) side of the substrate in order and zinc 15 is diffused onto the cap layer 24 (see FIG. 4 and FIG. 5). Next, like the first embodiment, each of the separation grooves 12 are respectively formed by selectively forming the p-side electrodes 15a, 15b, 15c, 15d and the power source connecting portions 14a, 14d on the cap layer 24 (see FIG. 6). Further, like the first embodiment, the embedding layers 12a are respectively embedded to each of the separation grooves 12 (see FIG. 7), and the insulating layer 16a is selectively formed on the surface of the p-side electrode 15a while the insulating layer 16b is selectively formed on the surface of the p-side electrode 15d (see FIG. 8).

After respectively forming the insulating layers 16a and 16b, as shown in FIG. 17, the extract electrodes 57a, 57b and the power source connecting portions 14b, 14c are respectively formed like the first embodiment. Then, as shown in FIG. 18, the insulating layer 56 made of silicon nitride is formed by, for example, CVD method by respectively corresponding to the laser oscillator 20a, 20b, 20c and 20d.

After forming the insulating layer 56, a photoresist film (not shown in figure) is formed in FIG. 19 by corresponding to the region which is not substantially covered by the electrically insulating layer 56, and the photoresist film (not shown in figure) is removed (lift-off process) by evaporating a metal layer made of, for example, aurum. As a result, as shown in FIG. 16, a radiation layer 59 is formed to cover each of the laser oscillators 20a, 20b, 20c and 20d.

After forming the radiation layer 59, like the first embodiment, the other surface side of the substrate 11 of FIG. 16 is lapped and the n-side electrode 18 is formed on the surface side before applying heat treatment. Then, the edge surface films 26 and 27 are respectively formed by cleaving the substrate 11 by corresponding to the forming region of each of the semiconductor lasers. After respectively forming the edge surface films 26 and 27, the substrate 11 is provided on the base 80 (see FIG. 2) by connecting the contact electrode 81 and the n-side electrode 18 with the adhesion layer 82 in between. Through this procedure, the semiconductor laser 400 shown in FIG. 16 is implemented.

As described, according to the embodiment, radiation effect can be easily and surely obtained since the radiation layer 59 is formed to correspond to each of the laser oscillators 20a, 20b, 20c and 20d.

Fourth Embodiment

Figure 20:
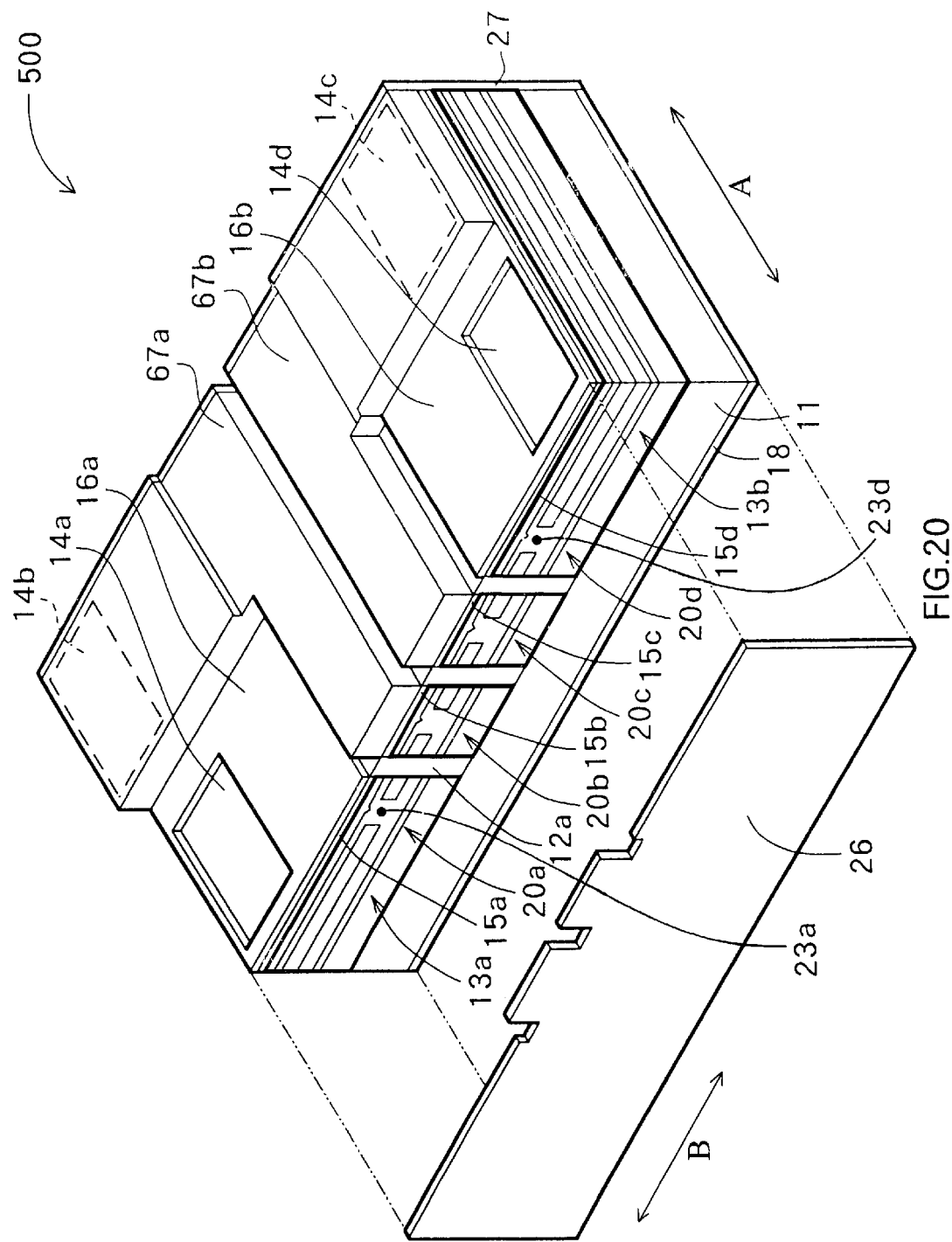
FIG. 20 is a perspective view showing a configuration of the semiconductor laser according to the fourth embodiment of the invention.

FIG. 20 shows a disassembled configuration of the semiconductor laser according to a fourth embodiment of the invention. The semiconductor laser 500 has the same configuration, operation and effects as those of the first embodiment except that the region of the laser oscillators 20b and 20c which are being covered by the extract electrodes 67a and 67b is different. Further, the semiconductor laser 500 can be formed like the first embodiment. Accordingly, here, like numerals are adopted to the identical structural elements and the detailed description is omitted. Further, like the first embodiment, the substrate 11 is supported by the base 80 (see FIG. 2) and the laser oscillators 20a, 20b, 20c and 20d are respectively formed on the opposite side (that is, one surface) of the base 80 of the substrate 11 in the semiconductor laser, however, the base 80 is omitted in the FIG. 20.

The extract electrodes 67a and 67b are not formed to cover 100% or the whole part of the current narrowing portions 23a and 23d of the laser oscillators 20a and 20d, respectively, but only part of each, unlike the first embodiment. In other words, the extract electrodes 67a and 67b may cover less than 100% of the current narrowing portions 23a and 23d. As a result, in the embodiment, radiation effect can be obtained according to the proportion of covering the laser oscillator 20a and 20d.

Fifth Embodiment

Figure 21:
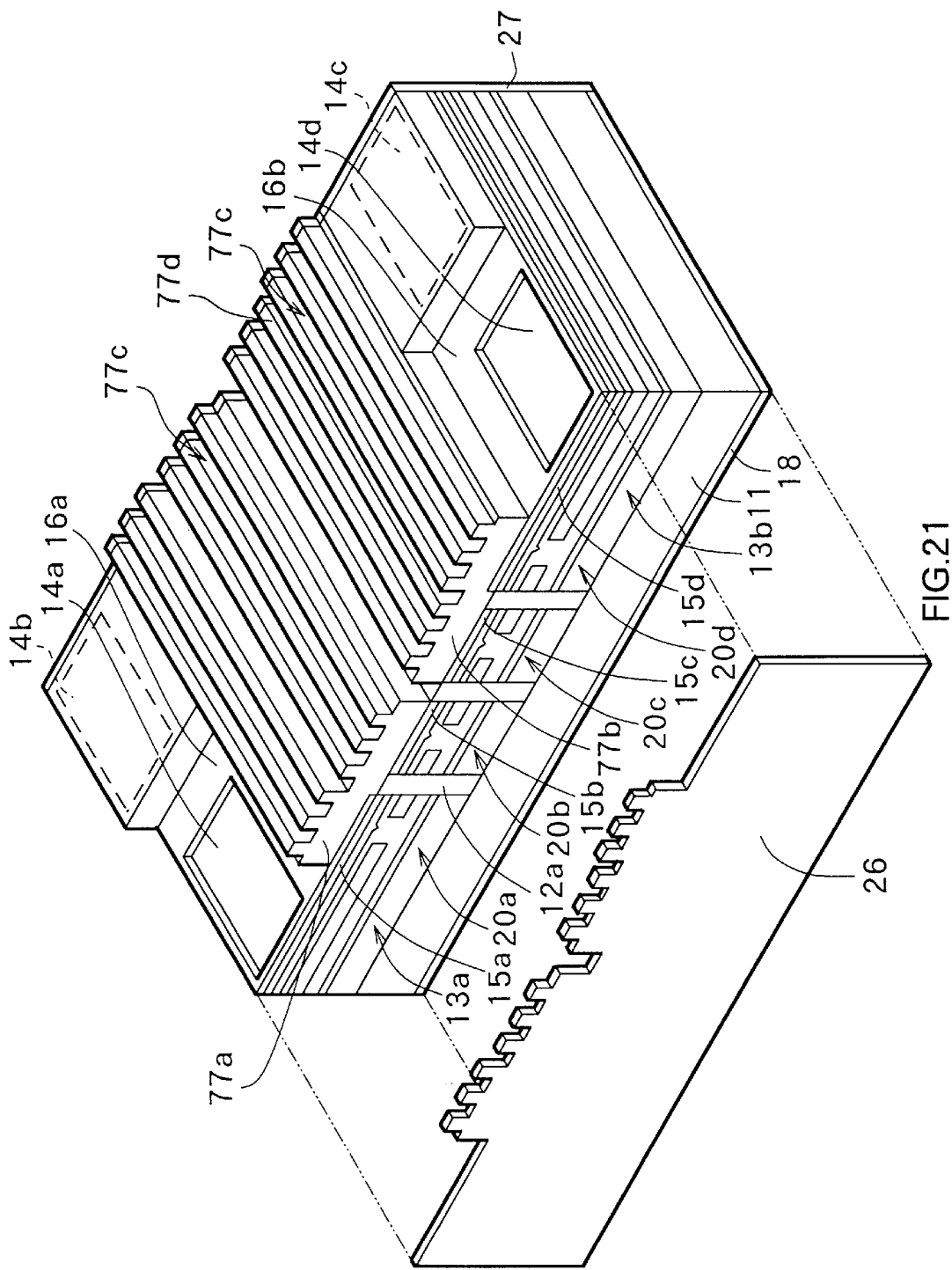
FIG. 21 is a perspective view showing a configuration of the semiconductor laser according to the fifth embodiment.

FIG. 21 shows a disassembled configuration of the semiconductor laser 600 according to a fifth embodiment of the invention. The semiconductor laser has the same configuration, operation and effects as those of the first embodiment except that concavo-convex areas 77c, 77d are respectively formed on the surface of the extract electrode 77a and 77b. Further, the semiconductor laser 600 can be formed like the first embodiment. Accordingly, here, like numerals are adopted to the identical structural elements and the detailed description is omitted. Further, like the first embodiment, the substrate 11 is supported by the base 80 (see FIG. 2) and the laser oscillators 20a, 20b, 20c and 20d are respectively formed on the opposite side (that is, one surface) of the base 80 of the substrate 11 in the semiconductor laser, however, the base 80 is omitted in the FIG. 21.

The extract electrodes 77a and 77b have a larger surface area by having the concavo-convex areas 77c formed on the surface so that they are able to radiate heat more effectively. The concavo-convex areas 77c have a configuration in which a plurality of convex areas 77d which have, for example, a width of 2 $\mu$m extended to the resonator direction A and a height of 2 $\mu$m are placed to a direction vertical to the resonator direction A at an interval of 2 μm. Further, the concavo-convex areas 77c may not be placed in order and may be formed irregularly. Further, it is preferable not to form the concavo-convex areas on the surface of the power source connecting portions 14b and 14c formed with the same material as the extract electrodes 77a and 77b in order to make connection with the power source easier.

Further, the concavo-convex areas 77c, 77d can be formed as follows. For example, part of the extract electrodes 77a and 77b are formed by evaporating and the photoresist film (not shown in figure) is formed on it by corresponding to the region between each of the convex areas 77d. Further, each of the convex areas 77d are formed by evaporating and the photoresist film (not shown in figure) is removed (lift-off process). As a result, the concavo-convex areas 77c, 77d are respectively formed on the surface of the extract electrodes 77a and 77b. Further, concavo-convex state of the surface may be obtained by ion injection, sputtering or etching after forming the extract electrodes 77a and 77b by evaporating.

As described, according to the embodiment, higher radiation effect can be obtained while increase of threshold current and deterioration of luminous efficacy can be suppressed more effectively since the concavo-convex areas 77c are respectively made to be provided in the extract electrodes 77a and 77b.

Further, however not described in detail here, the embodiment can be applied to the second to fourth embodiments as well.

The invention has been described by referring to each of the embodiments so far, however, it is not limited to the embodiments but can be implemented with various modification. For example, a semiconductor laser comprising four laser oscillators 20a, 20b, 20c and 20d on the same substrate 11 is specifically described in the first to fifth embodiments, however, the invention can be broadly applied to a semiconductor emission element comprising a plurality of emitting portions on the same substrate. For example, if more than four emitting portions are provided, the extract electrodes may be formed repeatedly with the insulating layer in between according to the number of the emitting portion. Further, the semiconductor emission element according to the first embodiment is especially effective for the semiconductor laser which comprises three or more laser oscillators on the same substrate.

Further, in the embodiments described above, the power source connecting portions 14a, 14b, 14c and 14d are made to be respectively formed in a peripheral region of the current narrowing portions 23a–23d of the emitting portions 20a–20d, however, they may be formed in a region which correspond to the emitting portion.

Further, in the embodiments described above, the power source connecting portions 14a, 14b, 14c and 14d are made to be respectively formed in a peripheral region of the emitting portion, however, they may be formed in a region which correspond to the emitting portion.

In addition, in the embodiments described above, each of the embedding layers 12a are formed with insulating materials, however, they may be formed with, for example, semiconductor or metal with the insulating layer in between.

Moreover, in the embodiments described above, each of the embedding layers 12a are respectively formed to the location which correspond to the p-side electrodes 15a, 15b, 15c and 15d, however, they may be formed at least in part of each separation groove 12.

In addition, in the embodiments described above, forming materials of each of the laser oscillators 20a, 20b, 20c and 20d are respectively described by referring to a specific example, however, the invention can be applied to a case where they are formed with other materials as well. For example, it can be applied to a case where the substrate and the clad layer are respectively formed by InP while the active layer is formed with InGaAsP or, to a case where the substrate is formed with GaAs and the clad layer is respectively formed with AlGaInP while the active layer is formed with GaInP as well.

Further, in the embodiments described above, the configurations of each of the laser oscillators 20a, 20b, 20c and 20d are respectively described by referring to an example, however, the invention can be applied to the one which has other configurations as well. For example, it can be applied to the ones that comprise a guide layer or the ones in which the p-type clad layer, the active layer and the n-type clad layer are laminated on the substrate in order as well.

In addition, in the embodiments described above, the semiconductor laser which comprises the laser oscillators 20a, 20b, 20c and 20d as the emitting portion are specifically described, however, the invention can be broadly applied to a semiconductor emission element comprising other emitting portion. For example, it can be applied to light emitting diode (LED).

Further, in the embodiments described above, a case of using MOCVD when laminating each of the semiconductor layers on the substrate 11 is specifically described, however, other methods such as molecular beam epitaxy (MBE) method can be used as well. Further, a case of using RIE method when selectively removing each of the semiconductor layers using the p-side electrodes 15a, 15b, 15c and 15d as a mask is specifically described, however, other methods such as dry etching or wet etching can be used as well.

As described, according to the semiconductor emission element of the invention, heat generated in the emitting portion can be actively radiated by the radiation layer. As a result, thermal interference can be terminated while deterioration of the performance of the emitting portion influenced by generation of heat can be suppressed even if the substrate 11 is provided on the base 80 with the opposite side of the emitting portion of the substrate facing the base. Accordingly, manufacturing becomes easy so that mass production becomes possible while maintaining high quality for a long period of time.

Especially, according to the semiconductor emission element of the invention, the radiation layer is made to be formed with metal so that high radiation effect can be obtained.

Further, according to the semiconductor emission element of the invention, the surface area of the radiation layer can be made larger so that high radiation effect can be obtained since the radiation layer is made to have the concavo-convex areas 77c, 77d of FIG. 21.

Further, according to the semiconductor emission element of the invention, a bad influence does not affect the emitting portion even if pressure is applied when connecting the power source connecting portion to the power source, since the power source connecting portions 14a–14d may be formed in a peripheral region of the current narrowing portions 23a–23d of the emitting portions 20a–20d.

In addition, according to the semiconductor emission element of the invention, the radiation layer can be easily formed without adding the manufacturing procedure of forming the radiation layer, since the radiation layer is made to have a function as an extract electrode.

Further, according to the semiconductor emission element of the invention, the radiation layer can be formed continuously with forming of each of the ohmic electrodes so that the radiation layer can be easily formed without adding the manufacturing procedure of forming the radiation layer, since a plurality of the radiation layers are made to be provided adjacent to each of the ohmic electrodes by being corresponded.

Further, according to the method of manufacturing the semiconductor emission element of the invention, the semiconductor emission element of the invention can be manufactured easily so that effect of easily implementing the semiconductor emission element can be obtained since it is made to include the procedure of forming the radiation layer to the substrate 11 with each of the emitting portions 20a–20d in between adjacent emitting portions.

Especially, according to the method of manufacturing the semiconductor emission element of the invention, the separation grooves 12 can be precisely formed through less procedure since they are made to be formed by selectively etching each of the semiconductor layer using the ohmic electrode 15a–15d as a mask as in FIG. 7. As a result, manufacturing procedure can be simplified and manufacturing cost can be lowered.

What is claimed is:

1. A semiconductor emission element, comprising:
    a base;
    a substrate comprising a first side and a second side, wherein the substrate is supported by the base on the first side of the substrate;
    a plurality of emitting portions, wherein each emitting portion includes a plurality of semiconductor layers that are laminated on the second side of the substrate;
    a plurality of ohmic electrodes disposed facing the second side of the substrate by corresponding to each of the emitting portions while being electrically connected to each of the emitting portions; and
    at least one radiation layer formed facing the second side of the substrate on at least one of the plurality of ohmic electrodes, wherein the at least one radiation layer functions as an extraction electrode, and wherein the extraction electrode includes a plurality of alternating concave areas and convex areas.

2. A semiconductor emission element according to claim 1 wherein the radiation layer includes metal.

3. A semiconductor emission element according to claim 1 wherein the radiation layer includes concavo-convex areas.

4. A semiconductor emission element according to claim 1, further comprising:
    a plurality of power source connecting portions that structurally are part of the same material as an associated ohmic electrode, wherein each of the ohmic electrodes is electrically coupled to at least one power source connecting portion.

5. A semiconductor emission element according to claim 4, wherein each emitting portion includes a current narrowing portion and wherein each power source connecting portion is disposed facing the second side of the substrate at a location that is not over any of the current narrowing portions.

6. A semiconductor emission element according to claim 1 wherein the radiation layer is provided over less than 100% of at least one emitting portion.

7. A semiconductor emission element according to claim 6 wherein the radiation layer is electrically connected to one of the ohmic electrodes so as to function as an extract electrode for the ohmic electrode.

8. A semiconductor emission element according to claim 6 wherein the radiation layer includes a plurality of the radiation layers, one for each of the ohmic electrodes.

9. A semiconductor emission element according to claim 6 wherein a thickness of the radiation layer is one of equal to and greater than 500 nm.

10. A semiconductor emission element according to claim 9, further comprising:
    an insulating layer disposed completely between the radiation layer and at least one of the ohmic electrodes.

11. A semiconductor emission element according to claim 1, further comprising:
    at least one embedding layer disposed between each of the plurality of emitting portions.

12. A semiconductor laser, comprising:
    a substrate comprising a first side and a second side;
    a base disposed on the first side of the substrate;
    a plurality of emitting portions disposed on the second side of the substrate;
    a plurality of ohmic electrodes, wherein each emitting portion is coupled between at least one ohmic electrode and the second side of the substrate; and
    means for radiating heat from the plurality of emitting portions, wherein the means for radiating heat is disposed facing the second side of the substrate and above the plurality of ohmic electrodes, and wherein the means for radiating heat includes a plurality of alternating concave areas and convex areas.

13. The semiconductor laser of claim 12, wherein the plurality of emitting portions include a laser oscillator, and
    wherein the means for radiating heat is a layer comprising a thickness that is one of equal to and greater than 500 nm.

14. The semiconductor laser of claim 12,
    wherein the plurality of emitting portions are disposed in a placement direction B so as to define a first end emitting portion and a second end emitting portion, wherein the remaining emitting portions are disposed between the first end emitting portion and the second end emitting portion,
    wherein each of the first end emitting portion and a second end emitting portion includes a current narrowing portion, and
    wherein the means for radiating heat is disposed over each current narrowing portion.

15. The semiconductor laser of claim 14, wherein the means for radiating heat is disposed over 100% of each current narrowing portion.

16. The semiconductor laser of claim 14, wherein the means for radiating heat is disposed over less than 100% of at least one current narrowing portion.

17. The semiconductor laser of claim 12, further comprising:
    plurality of power source connecting portions, wherein each power source connection portion is disposed facing the second side of the substrate at a location that is not above a current narrowing portion,
    wherein the plurality of alternating concave areas and convex areas are disposed between the plurality of power source connecting portions.

18. The semiconductor laser of claim 17, wherein a width of each convex area and concave area and a height between each convex area and concave area are equal.

19. The semiconductor laser of claim 18, wherein the width of each convex area and concave area and the height between each convex area and concave area is 2 $\mu$m.

20. The semiconductor laser of claim 12,
    wherein the plurality of emitting portions are disposed in a placement direction B so as to define a first end emitting portion and a second end emitting portion, wherein the remaining emitting portions are disposed between the first end emitting portion and the second end emitting portion so as to define a plurality of interior emitting portions, and wherein the means for radiating heat is electrically insulated from the ohmic electrode of each of the first end emitting portion and a second end emitting portion.

21. The semiconductor laser of claim 20, further comprising:

at least one extraction electrode disposed above the ohmic electrode of each interior emitting portion, wherein the means for radiating heat is a radiation layer and wherein the radiation layer is electrically isolated from each extraction electrode.

22. The semiconductor laser of claim 21, wherein a thickness of the at least one extraction electrode is less than 500 nm and a thickness of the radiation layer is one of equal to and greater than 500 $\mu$m.

23. The semiconductor laser of claim 22, wherein the thickness of the at least one extraction electrode is one of equal to and less than 100 nm and the thickness of the radiation layer ranges from 500 nm to 1000 nm.

24. The semiconductor laser of claim 20, wherein the means for radiating heat is electrically coupled to the ohmic electrode of at least one interior emitting portion.

25. The semiconductor laser of claim 24, wherein the means for radiating heat is a plurality of radiation layers, the semiconductor laser further comprising:

at least one extraction electrode disposed above the ohmic electrode of at least one interior emitting portion such that at least one radiation layer is disposed between the at least one extraction electrode and the ohmic electrode of the at least one interior emitting portion.

26. The semiconductor laser of claim 25, wherein a thickness of the at least one extraction electrode is less than 500 nm and a thickness of the radiation layer is one of equal to and greater than 500 nm.

27. The semiconductor laser of claim 26, wherein the thickness of the at least one extraction electrode is one of equal to and less than 100 nm and the thickness of the radiation layer ranges from 500 nm to 1000 nm.

28. The semiconductor laser of claim 24, wherein the means for radiating heat includes at least one extraction electrode comprising a thickness that is one of equal to or greater than 500 nm.

29. The semiconductor laser of claim 28, wherein the plurality of emitting portions are disposed in a placement direction B so as to define a first end emitting portion and a second end emitting portion, wherein the remaining emitting portions are disposed between the first end emitting portion and the second end emitting portion, wherein each of the first end emitting portion and a second end emitting portion includes a current narrowing portion, and wherein the at least one extraction electrode is disposed over a current narrowing portion.

30. The semiconductor laser of claim 29, wherein the at least one extraction electrode is disposed over 100% of the current narrowing portion.

31. The semiconductor laser of claim 29, wherein the at least one extraction electrode is disposed over less than 100% of the current narrowing portion.

32. The semiconductor laser of claim 12, further comprising:

a plurality of power source connecting portions, wherein each power source connection portion is disposed facing the second side of the substrate at a location that is not above a current narrowing portion, wherein the plurality of alternating concave areas and convex areas are disposed between the plurality of power source connecting portions.

33. The semiconductor laser of claim 32, wherein a width of each convex area and concave area and a height between each convex area and concave area are equal.

34. The semiconductor laser of claim 33, wherein the width of each convex area and concave area and the height between each convex area and concave area is 2 $\mu$m.

* * * * *